United States Patent
Luby et al.

(10) Patent No.: US 9,350,484 B2
(45) Date of Patent: May 24, 2016

(54) TRANSPORT ACCELERATOR IMPLEMENTING SELECTIVE UTILIZATION OF REDUNDANT ENCODED CONTENT DATA FUNCTIONALITY

(71) Applicant: QUALCOMM Incorporated, San Diego, CA (US)

(72) Inventors: Michael George Luby, Berkeley, CA (US); Shravya Kunamalla, College Station, TX (US); Lorenz Christoph Minder, Evanston, IL (US)

(73) Assignee: QUALCOMM Incorporated, San Diego, CA (US)

( * ) Notice: Subject to any disclaimer, the term of this patent is extended or adjusted under 35 U.S.C. 154(b) by 94 days.

(21) Appl. No.: 14/289,458

(22) Filed: May 28, 2014

(65) Prior Publication Data

US 2015/0270930 A1    Sep. 24, 2015

Related U.S. Application Data

(60) Provisional application No. 61/954,987, filed on Mar. 18, 2014.

(51) Int. Cl.
*H04L 1/00* (2006.01)
*H03M 13/35* (2006.01)
*H04L 1/08* (2006.01)
(Continued)

(52) U.S. Cl.
CPC ........... *H04L 1/0009* (2013.01); *H03M 13/353* (2013.01); *H04L 1/0041* (2013.01); *H04L 1/0042* (2013.01); *H04L 1/0057* (2013.01); *H04L 1/08* (2013.01); *H04L 67/02* (2013.01); *H04L 67/42* (2013.01); *H04L 69/16* (2013.01)

(58) Field of Classification Search
CPC ... H04L 1/0009; H04L 1/0042; H03M 13/353
See application file for complete search history.

(56) References Cited

U.S. PATENT DOCUMENTS 7,403,542 B1 * 7/2008 Thompson ............. H04L 69/16
                                                    370/389
7,447,235 B2   11/2008 Luby et al.
(Continued)

FOREIGN PATENT DOCUMENTS

EP          2615790 A1    7/2013
WO    WO-2011038034 A1    3/2011
(Continued)

OTHER PUBLICATIONS

Seth A., et al., "A Policy-Oriented Architecture for Opportunistic Communication on Multiple Wireless Networks," IEEE Transactions on Mobile Computing, Aug. 2006, pp. 1-15.
(Continued)

*Primary Examiner* — Joseph D Torres
(74) *Attorney, Agent, or Firm* — Norton Rose Fulbright US LLP

(57) ABSTRACT

Transport accelerator (TA) systems and methods for delivery of content to a user agent (UA) of a client device are provided according to embodiments of the present disclosure. Embodiments receive, by a request manager (RM) of the TA, fragment requests provided by the UA for requesting content from a content server, and determine an amount of redundant encoded content data to request for a fragment request of the fragment requests for use by the RM in recovering the fragment.

52 Claims, 5 Drawing Sheets

(51) Int. Cl.
*H04L 29/06* (2006.01)
*H04L 29/08* (2006.01)

(56) References Cited

U.S. PATENT DOCUMENTS

| | | | |
|---|---|---|---|
| 7,502,860 | B1 | 3/2009 | Champagne |
| 7,818,430 | B2 | 10/2010 | Zuckerman et al. |
| 8,396,126 | B2 | 3/2013 | Rodriguez et al. |
| 8,750,188 | B2 | 6/2014 | Nicoara et al. |
| 8,838,095 | B2 | 9/2014 | Jouin |
| 2002/0164024 | A1 | 11/2002 | Arakawa et al. |
| 2003/0005386 | A1* | 1/2003 | Bhatt .................. H04L 1/0009 714/774 |
| 2005/0207415 | A1* | 9/2005 | Curcio .................. H04L 67/14 370/390 |
| 2008/0137671 | A1* | 6/2008 | Agarwal ................ H04L 45/38 370/401 |
| 2008/0208985 | A1 | 8/2008 | Georgis et al. |
| 2010/0036846 | A1* | 2/2010 | Rafiq ................ G06F 17/30306 707/783 |
| 2010/0058036 | A1* | 3/2010 | Degenaro .............. G06F 9/5027 712/220 |
| 2010/0179984 | A1* | 7/2010 | Sebastian ............ H04L 12/1859 709/203 |
| 2011/0096828 | A1* | 4/2011 | Chen ................ H04N 21/23106 375/240.02 |
| 2011/0239078 | A1 | 9/2011 | Luby et al. |
| 2011/0320523 | A1* | 12/2011 | Chan .................... G06F 17/301 709/203 |
| 2011/0320804 | A1* | 12/2011 | Chan .................. G06F 12/0862 713/150 |
| 2012/0057511 | A1 | 3/2012 | Sivakumar et al. |
| 2012/0140621 | A1 | 6/2012 | Wu et al. |
| 2012/0272124 | A1 | 10/2012 | Huang |
| 2012/0311174 | A1 | 12/2012 | Bichot et al. |
| 2012/0327779 | A1 | 12/2012 | Gell et al. |
| 2013/0013799 | A1 | 1/2013 | Keum et al. |
| 2013/0028089 | A1 | 1/2013 | Ramakrishnan |
| 2013/0095806 | A1 | 4/2013 | Salkintzis et al. |
| 2013/0132507 | A1 | 5/2013 | Swaminathan et al. |
| 2013/0166982 | A1 | 6/2013 | Zheng et al. |
| 2013/0191511 | A1 | 7/2013 | Liu et al. |
| 2013/0227080 | A1 | 8/2013 | Gao et al. |
| 2013/0227102 | A1 | 8/2013 | Beck et al. |
| 2013/0227122 | A1 | 8/2013 | Gao et al. |
| 2013/0246643 | A1 | 9/2013 | Luby et al. |
| 2013/0254631 | A1 | 9/2013 | Luby et al. |
| 2013/0304847 | A1 | 11/2013 | Ewanchuk et al. |
| 2013/0339543 | A1 | 12/2013 | Fall |
| 2014/0040353 | A1* | 2/2014 | Sebastian ................ H04L 67/06 709/203 |
| 2014/0323178 | A1 | 10/2014 | Wei et al. |

FOREIGN PATENT DOCUMENTS

| | | |
|---|---|---|
| WO | WO-2013030096 | 3/2013 |
| WO | WO-2013067219 A2 | 5/2013 |
| WO | WO-2013130473 A1 | 9/2013 |

OTHER PUBLICATIONS

Detti A., et al., "Supporting Mobile Applications with Information Centric Networking: the Case of P2P Live Adaptive Video Streaming," Proceedings of the 3rd ACM SIGCOMM workshop on Information-centric networking, 2013, pp. 35-36.

Kaspar D., et al., "Using HTTP Pipelining to Improve Progressive Download over Multiple Heterogeneous Interfaces," IEEE International Conference on Communications (ICC), 2010, 5 pages.

Kim, J., et al., "Multi-source Multipath HTTP (mHTTP): A Proposal," Dec. 10, 2013, 12 pages, Cornell University Library, Available at http://arxiv.org/abs/1310.2748.

International Search Report and Written Opinion—PCT/US2015/021019—ISA/EPO—Jun. 3, 2015.

\* cited by examiner

TRANSPORT ACCELERATOR IMPLEMENTING SELECTIVE UTILIZATION OF REDUNDANT ENCODED CONTENT DATA FUNCTIONALITY

PRIORITY AND RELATED APPLICATIONS STATEMENT

The present application claims priority to U.S. Provisional Patent Application No. 61/954,987, entitled "TRANSPORT ACCELERATOR IMPLEMENTING SELECTIVE UTILIZATION OF REDUNDANT ENCODED CONTENT DATA FUNCTIONALITY," filed Mar. 18, 2014, the disclosure of which is hereby incorporated herein by reference. This application is related to commonly assigned U.S. patent application Ser. No. 14/289,016, filed May 28, 2014, entitled "TRANSPORT ACCELERATOR IMPLEMENTING EXTENDED TRANSMISSION CONTROL FUNCTIONALITY," Ser. No. 14/289,181, filed May 28, 2014, entitled "TRANSPORT ACCELERATOR IMPLEMENTING EXTENDED TRANSMISSION CONTROL FUNCTIONALITY," Ser. No. 14/289,348, filed May 28, 2014, entitled "TRANSPORT ACCELERATOR IMPLEMENTING ENHANCED SIGNALING," Ser. No. 14/289,403, filed May 28, 2014, entitled "TRANSPORT ACCELERATOR IMPLEMENTING REQUEST MANAGER AND CONNECTION MANAGER FUNCTIONALITY," Ser. No. 14/289,476, filed May 28, 2014, entitled "TRANSPORT ACCELERATOR IMPLEMENTING A MULTIPLE INTERFACE ARCHITECTURE," and Ser. No. 14/289,499, filed May 28, 2014, entitled "TRANSPORT ACCELERATOR IMPLEMENTING CLIENT SIDE TRANSMISSION FUNCTIONALITY," each of which being concurrently filed herewith and the disclosures of which are expressly incorporated by reference herein in their entirety.

DESCRIPTION OF THE RELATED ART

More and more content is being transferred over available communication networks. Often, this content includes numerous types of data including, for example, audio data, video data, image data, etc. Video content, particularly high resolution video content, often comprises a relatively large data file or other collection of data. Accordingly, a user agent (UA) on an end user device or other client device which is consuming such content often requests and receives a sequence of fragments of content comprising the desired video content. For example, a UA may comprise a client application or process executing on a user device that requests data, often multimedia data, and receives the requested data for further processing and possibly for display on the user device.

Many types of applications today rely on Hypertext Transfer Protocol (HTTP) for the foregoing content delivery. In many such applications the performance of the HTTP transport is critical to the user's experience with the application. For example, live streaming has several constraints that can hinder the performance of a video streaming client. Two constraints stand out particularly. First, media segments become available one after another over time. This constraint prevents the client from continuously downloading a large portion of data, which in turn affects the accuracy of download rate estimate. Since most streaming clients operate on a "request-download-estimate" loop, it generally does not do well when the download estimate is inaccurate. Second, when viewing a live event streaming, users generally don't want to suffer a long delay from the actual live event timeline. Such a behavior prevents the streaming client from building up a large buffer, which in turn may cause more rebuffering.

Where the streaming client operates over Transport Control Protocol (TCP) (as do most Dynamic Adaptive Streaming over HTTP (DASH) clients), the client typically requests fragments based upon an estimated availability schedule. Where a packet of a fragment is not received, existing TCP protocols are utilized to slow the transmission of data and to re-request missing data carried in the packet. For example, the receiver will only acknowledge (ACK) up to the NextByteExpected, where NextByteExpected refers to the first byte of data of a fragment carried in the missing packet. After that if out of order packets are received carrying data beyond NextByteExpected but not including byte NextByteExpected of the fragment, the receiver will send out duplicate ACKs corresponding to NextByteExpected and the sender will interpret such duplicate ACKs as signs of congestion in the network, hence slowing down the sending rate by way of reducing the congestion window. Accordingly, recovery of missing or delayed portions of content data can be problematic not only due to the delay involved in retransmission of such data, but also due to sending rate often being slowed in response to the associated detection of network congestion.

Although it may be possible to proactively address at least some level of content data failing to be received by a client using redundant encoded data techniques (e.g., Forward Error Correction (FEC) coding), care must be taken when using such techniques when applied to streaming content. Depending on the design of the protocols, proactive sending of redundant encoded data can consume additional bandwidth due to the redundancy of the data encoding for supporting recovery of potentially missing data. However, streaming content without such redundancies may suffer from undesirable end-to-end latencies, especially when applied to live streaming and using TCP as the underlying delivery protocol. The foregoing is particularly the case where the streaming client operates over TCP (e.g., as a DASH client) due to the protocol's operation to assure delivery of data, but perhaps with a delayed or reduced rate delivery.

SUMMARY

A method for accelerating, by a transport accelerator (TA) of a client device, delivery of content to a user agent (UA) of the client device is provided according to embodiments of the present disclosure. The method of embodiments includes receiving, by a request manager (RM) of the TA, fragment requests provided by the UA for requesting content from a content server, and determining an amount of redundant encoded content data to request for a fragment request of the fragment requests for use by the RM in recovering the fragment.

An apparatus configured for accelerating, by a transport accelerator (TA) of a client device, delivery of content to a user agent (UA) of the client device is provided according to embodiments of the present disclosure. The apparatus of embodiments includes means for receiving, by a request manager (RM) of the TA, fragment requests provided by the UA for requesting content from a content server, and means for determining an amount of redundant encoded content data to request for a fragment request of the fragment requests for use by the RM in recovering the fragment.

A computer program product for accelerating, by a transport accelerator (TA) of a client device, delivery of content to a user agent (UA) of the client device is provided according to embodiments of the present disclosure. The computer program product includes a non-transitory computer-readable medium having program code recorded thereon. The program code of embodiments includes program code to receive, by a request manager (RM) of the TA, fragment requests provided by the UA for requesting content from a content server, and program code to determine an amount of redundant encoded content data to request for a fragment request of the fragment requests for use by the RM in recovering the fragment.

An apparatus configured for accelerating, by a transport accelerator (TA) of a client device, delivery of content to a user agent (UA) of the client device is provided according to embodiments of the present disclosure. The apparatus includes at least one processor, and a memory coupled to the at least one processor. The at least one processor of embodiments is configured to receive, by a request manager (RM) of the TA, fragment requests provided by the UA for requesting content from a content server, and to determine an amount of redundant encoded content data to request for a fragment request of the fragment requests for use by the RM in recovering the fragment.

DETAILED DESCRIPTION

Figure 1:
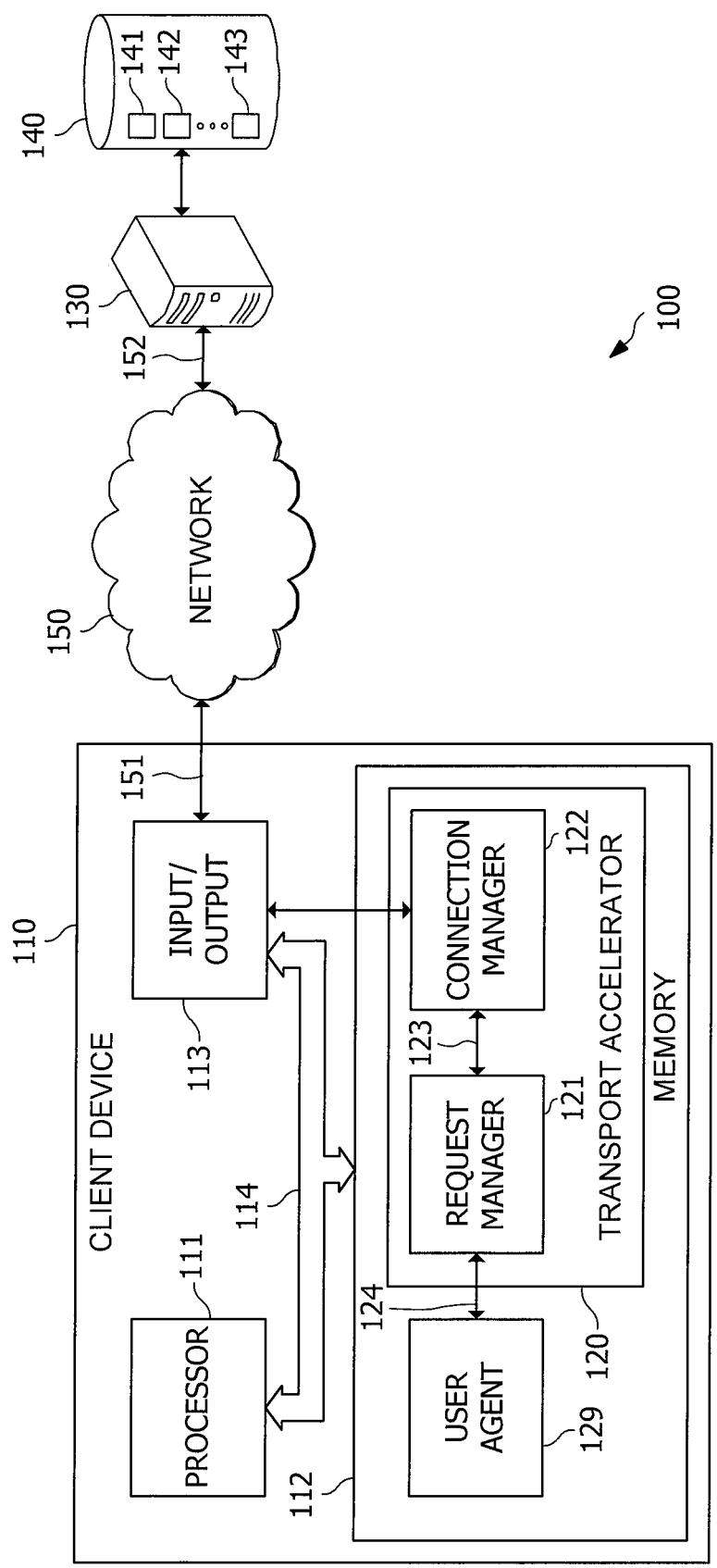
FIG. 1 shows a system adapted to provide transfer of content by a Transport Accelerator implementing selective utilization of redundant encoded content data according to embodiments of the present disclosure.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

As used in this description, the term "content" may include data having video, audio, combinations of video and audio, or other data at one or more quality levels, the quality level determined by bit rate, resolution, or other factors. The content may also include executable content, such as: object code, scripts, byte code, markup language files, and patches. In addition, "content" may also include files that are not executable in nature, such as documents that may need to be opened or other data files that need to be accessed.

As used in this description, the term "fragment" refers to one or more portions of content that may be requested by and/or received at a user device.

As used in this description, the term "streaming content" refers to content that may be sent from a server device and received at a user device according to one or more standards that enable the real-time transfer of content or transfer of content over a period of time. Examples of streaming content standards include those that support de-interleaved (or multiple) channels and those that do not support de-interleaved (or multiple) channels.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

As used herein, the terms "user equipment," "user device," and "client device" include devices capable of requesting and receiving content from a web server and transmitting information to a web server. Such devices can be a stationary devices or mobile devices. The terms "user equipment," "user device," and "client device" can be used interchangeably.

As used herein, the term "user" refers to an individual receiving content on a user device or on a client device and transmitting information to a website.

FIG. 1 shows system 100 adapted according to the concepts herein to provide transfer of content, such as may comprise audio data, video data, image data, file data, etc., over communication networks. Accordingly, client device 110 is shown in communication with server 130 via network 150, whereby server 130 may transfer various content stored in database 140 to client device 110 in accordance with the concepts of the present disclosure. It should be appreciated that, although only a single client device and a single server and database are represented in FIG. 1, system 100 may comprise a plurality of any or all such devices. For example, server 130 may comprise a server of a server farm, wherein a plurality of servers may be disposed centrally and/or in a distributed configuration, to serve high levels of demand for content transfer. Alternatively, server 130 may be collocated on the same device as transport accelerator 120 (e.g., connected to transport accelerator 120 directly through I/O element 113, instead of through network 150) such as when some or all of the content resides in a database 140 (cache) that is also collocated on the device and provided to transport accelerator 120 through server 130. Likewise, users may possess a plurality of client devices and/or a plurality of users may each possess one or more client devices, any or all of which are adapted for content transfer according to the concepts herein.

Client device 110 may comprise various configurations of devices operable to receive transfer of content via network 150. For example, client device 110 may comprise a wired device, a wireless device, a personal computing device, a tablet or pad computing device, a portable cellular telephone, a WiFi enabled device, a Bluetooth enabled device, a television, a pair of glasses having a display, a pair of augmented reality glasses, or any other communication, computing or interface device connected to network 150 which can communicate with server 130 using any available methodology or infrastructure. Client device 110 is referred to as a "client device" because it can function as, or be connected to, a device that functions as a client of server 130.

Client device 110 of the illustrated embodiment comprises a plurality of functional blocks, shown here as including processor 111, memory 112, and input/output (I/O) element 113. Although not shown in the representation in FIG. 1 for simplicity, client device 110 may comprise additional functional blocks, such as a user interface, a radio frequency (RF) module, a camera, a sensor array, a display, a video player, a browser, etc., some or all of which may be utilized by operation in accordance with the concepts herein. The foregoing functional blocks may be operatively connected over one or more buses, such as bus 114. Bus 114 may comprises the logical and physical connections to allow the connected elements, modules, and components to communicate and interoperate.

Memory 112 can be any type of volatile or non-volatile memory, and in an embodiment, can include flash memory. Memory 112 can be permanently installed in client device 110, or can be a removable memory element, such as a removable memory card. Although shown as a single element, memory 112 may comprise multiple discrete memories and/or memory types.

Memory 112 may store or otherwise include various computer readable code segments, such as may form applications, operating systems, files, electronic documents, content, etc. For example, memory 112 of the illustrated embodiment comprises computer readable code segments defining Transport Accelerator (TA) 120 and UA 129, which when executed by a processor (e.g., processor 111) provide logic circuits operable as described herein. The code segments stored by memory 112 may provide applications in addition to the aforementioned TA 120 and UA 129. For example, memory 112 may store applications such as a browser, useful in accessing content from server 130 according to embodiments herein. Such a browser can be a web browser, such as a hypertext transfer protocol (HTTP) web browser for accessing and viewing web content and for communicating via HTTP with server 130 over connections 151 and 152, via network 150, if server 130 is a web server. As an example, an HTTP request can be sent from the browser in client device 110, over connections 151 and 152, via network 150, to server 130. A HTTP response can be sent from server 130, over connections 152 and 151, via network 150, to the browser in client device 110.

UA 129 is operable to request and/or receive content from a server, such as server 130. UA 129 may, for example, comprise a client application or process, such as a browser, a DASH client, a HTTP Live Streaming (HLS) client, etc., that requests data, such as multimedia data, and receives the requested data for further processing and possibly for display on a display of client device 110. For example, client device 110 may execute code comprising UA 129 for playing back media, such as a standalone media playback application or a browser-based media player configured to run in an Internet browser. In operation according to embodiments, UA 129 decides which fragments or sequences of fragments of a content file to request for transfer at various points in time during a streaming content session. For example, a DASH client configuration of UA 129 may operate to decide which fragment to request from which representation of the content (e.g., high resolution representation, medium resolution representation, low resolution representation, etc.) at each point in time, such as based on recent download conditions. Likewise, a web browser configuration of UA 129 may operate to make requests for web pages, or portions thereof, etc. Typically, the UA requests such fragments using HTTP requests.

TA 120 is adapted according to the concepts herein to provide enhanced delivery of fragments or sequences of fragments of desired content (e.g., the aforementioned content fragments as may be used in providing video streaming, file download, web-based applications, general web pages, etc.). TA 120 of embodiments is adapted to allow a generic or legacy UA (i.e., a UA which has not been predesigned to interact with the TA) that only supports a standard interface, such as a HTTP 1.1 interface implementing standardized TCP transmission protocols, for making fragment requests to nevertheless benefit from using the TA executing those requests. Additionally or alternatively, TA 120 of embodiments provides an enhanced interface to facilitate providing further benefits to UAs that are designed to take advantage of the functionality of the enhanced interface. TA 120 of embodiments is adapted to execute fragment requests in accordance with existing content transfer protocols, such as using TCP over a HTTP interface implementing standardized TCP transmission protocols, thereby allowing a generic or legacy media server (i.e., a media server which has not been predesigned to interact with the TA) to serve the requests while providing enhanced delivery of fragments to the UA and client device.

In providing the foregoing enhanced fragment delivery functionality, TA 120 of the embodiments herein comprises architectural components and protocols as described herein. For example, TA 120 of the embodiment illustrated in FIG. 1 comprises Request Manager (RM) 121 and Connection Manager (CM) 122 which cooperate to provide various enhanced fragment delivery functionality, as described further below.

In addition to the aforementioned code segments forming applications, operating systems, files, electronic documents, content, etc., memory 112 may include or otherwise provide various registers, buffers, and storage cells used by functional blocks of client device 110. For example, memory 112 may comprise a play-out buffer, such as may provide a first-in/first-out (FIFO) memory for spooling data of fragments for streaming from server 130 and playback by client device 110.

Processor 111 of embodiments can be any general purpose or special purpose processor capable of executing instructions to control the operation and functionality of client device 110. Although shown as a single element, processor 111 may comprise multiple processors, or a distributed processing architecture.

I/O element 113 can include and/or be coupled to various input/output components. For example, I/O element 113 may include and/or be coupled to a display, a speaker, a microphone, a keypad, a pointing device, a touch-sensitive screen, user interface control elements, and any other devices or systems that allow a user to provide input commands and receive outputs from client device 110. Any or all such components may be utilized to provide a user interface of client device 110. Additionally or alternatively, I/O element 113 may include and/or be coupled to a disk controller, a network interface card (NIC), a radio frequency (RF) transceiver, and any other devices or systems that facilitate input and/or output functionality of client device 110.

In operation to access and play streaming content, client device 110 communicates with server 130 via network 150, using links 151 and 152, to obtain content data (e.g., as the aforementioned fragments) which, when rendered, provide playback of the content. Accordingly, UA 129 may comprise a content player application executed by processor 111 to establish a content playback environment in client device 110. When initiating playback of a particular content file, UA 129 may communicate with a content delivery platform of server 130 to obtain a content identifier (e.g., one or more lists, manifests, configuration files, or other identifiers that identify media segments or fragments, and their timing boundaries, of the desired content). The information regarding the media segments and their timing is used by streaming content logic of UA 129 to control requesting fragments for playback of the content.

Server 130 comprises one or more systems operable to serve desired content to client devices. For example, server 130 may comprise a standard HTTP web server operable to stream content to various client devices via network 150. Server 130 may include a content delivery platform comprising any system or methodology that can deliver content to user device 110. The content may be stored in one or more databases in communication with server 130, such as database 140 of the illustrated embodiment. Database 140 may be stored on server 130 or may be stored on one or more servers communicatively coupled to server 130. Content of database 140 may comprise various forms of data, such as video, audio, streaming text, and any other content that can be transferred to client device 110 over a period of time by server 130, such as live webcast content and stored media content.

Database 140 may comprise a plurality of different source or content files and/or a plurality of different representations of any particular content (e.g., high resolution representation, medium resolution representation, low resolution representation, etc.). For example, content file 141 may comprise a high resolution representation, and thus high bit rate representation when transferred, of a particular multimedia compilation while content file 142 may comprise a low resolution representation, and thus low bit rate representation when transferred, of that same particular multimedia compilation. Additionally or alternatively, the different representations of any particular content may comprise a Forward Error Correction (FEC) representation (e.g., a representation including redundant encoding of content data), such as may be provided by content file 143. A Uniform Resource Locator (URL), Uniform Resource Identifier (URI), and/or Uniform Resource Name (URN) is associated with all of these content files according to embodiments herein, and thus such URLs, URIs, and/or URNs may be utilized, perhaps with other information such as byte ranges, for identifying and accessing requested data.

Network 150 can be a wireless network, a wired network, a wide area network (WAN), a local area network (LAN), or any other network suitable for the transfer of content as described herein. In an embodiment, network 150 can comprise at least portions of the Internet. Client device 110 can be connected to network 150 over a bi-directional connection, such as is represented by network connection 151. Alternatively, client device 110 can be connected via a uni-directional connection, such as that provided by a Multimedia Broadcast Multimedia System (MBMS) enabled network (e.g., connections 151, 152 and network 150 may comprise a MBMS network, and server 130 may comprise a Broadcast Multicast Service Center (BM-SC) server). The connection can be a wired connection or can be a wireless connection. In an embodiment, connection 151 can be a wireless connection, such as a cellular 4G connection, a wireless fidelity (WiFi) connection, a Bluetooth connection, or another wireless connection. Server 130 can be connected to network 150 over a bi-directional connection, such as represented by network connection 152. Server 130 can be connected to network 150 over a uni-directional connection (e.g. a MBMS network using protocols and services as described in 3GPP TS.26.346 or an ATSC 3.0 network). The connection can be a wired connection or can be a wireless connection.

Client device 110 of the embodiment illustrated in FIG. 1 comprises TA 120 operable to provide enhanced delivery of fragments or sequences of fragments of desired content according to the concepts herein. As discussed above, TA 120 of the illustrated embodiment comprises RM 121 and CM 122 which cooperate to provide various enhanced fragment delivery functionality. Interface 124 between UA 129 and RM 121 and interface 123 between RM 121 and CM 122 of embodiments provide an HTTP-like connection. For example, the foregoing interfaces may employ standard HTTP protocols as well as including additional signaling (e.g., provided using signaling techniques similar to those of HTTP) to support certain functional aspects of enhanced fragment delivery according to embodiments herein.

In operation according to embodiments RM 121 receives requests for fragments from UA 129 and decides what data to request from CM 122 to reliably receive and recover requested fragments. In accordance with embodiments herein, RM 121 is adapted to receive and respond to fragment requests from a generic or legacy UA (i.e., a UA which has not been predesigned to interact with the RM), thereby providing compatibility with such legacy UAs. Accordingly, RM 121 may operate to isolate UA 129 from the extended transmission protocol operation of TA 120. However, as will be more fully understood from the discussion which follows, UA 129 may be adapted for extended transmission protocol operation, whereby RM 121 and UA 129 cooperate to implement one or more features of the extended transmission protocol operation, such as through the use of signaling between RM 121 and UA 129 for implementing such features.

The size of data requests (referred to herein as "chunk requests" wherein the requested data comprises a "chunk") made by RM 121 to CM 122 of embodiments can be much less than the size of the fragment requested by UA 129, and which fragment RM 121 is recovering. Thus, each fragment request from UA 129 may trigger RM 121 to generate and make multiple chunk requests to CM 122 to recover that fragment.

Some of the chunk requests made by RM 121 to CM 122 may be for data already requested that has not yet arrived, and which RM 121 has deemed may never arrive or may arrive too late. Additionally or alternatively, some of the chunk requests made by RM 121 to CM 122 may be for FEC encoded data generated from the original fragment, whereby RM 121 may FEC decode the data received from CM 122 to recover the fragment, or some portion thereof. RM 121 delivers recovered fragments to UA 129. Accordingly, there may be various configurations of RMs according to embodiments, such as may comprise a basic RM configuration (RM-basic) which does not use FEC data and thus only requests portions of data from the original source fragments and a FEC RM configuration (RM-FEC) which can request portions of data from the original source fragments as well as matching FEC fragments generated from the source fragments.

RM 121 of embodiments may be unaware of timing and/or bandwidth availability constraints, thereby facilitating a relatively simple interface between RM 121 and CM 122, and thus RM 121 may operate to make chunk requests without consideration of such constraints by RM 121. Alternatively, RM 121 may be adapted for awareness of timing and/or bandwidth availability constraints, such as may be supplied to RM 121 by CM 122 or other modules within client device 110, and thus RM 121 may operate to make chunk requests based upon such constraints.

RM 121 of embodiments is adapted for operation with a plurality of different CM configurations. Moreover, RM 121 of some embodiments may interface concurrently with more than one CM, such as to request data chunks of the same fragment or sequence of fragments from a plurality of CMs. Each such CM may, for example, support a different network interface (e.g., a first CM may have a local interface to an on-device cache, a second CM may use HTTP/TCP connections to a 3G network interface, a third CM may use HTTP/TCP connections to a 4G/LTE network interface, a fourth CM may use HTTP/TCP connections to a WiFi network interface, etc.).

In operation according to embodiments CM 122 interfaces with RM 121 to receive chunk requests, and sends those requests over network 150. CM 122 receives the responses to the chunk requests and passes the responses back to RM 121, wherein the fragments requested by UA 129 are resolved from the received chunks. Functionality of CM 122 operates to decide when to request data of the chunk requests made by RM 121. In accordance with embodiments herein, CM 122 is adapted to request and receive chunks from generic or legacy servers (i.e., a server which has not been predesigned to interact with the TA). For example, the server(s) from which CM 122 requests the data may comprise standard HTTP web servers. Alternatively, the server(s) from which CM 122 receives the data may comprise BM-SC servers used in MBMS services deployment.

As with RM 121 discussed above, there may be various configurations of CMs according to embodiments. For example, a multiple connection CM configuration (e.g., CM-mHTTP) may be provided whereby the CM is adapted to use HTTP over multiple TCP connections. A multiple connection CM configuration may operate to dynamically vary the number of connections (e.g., TCP connections), such as depending upon network conditions, demand for data, congestion window, etc. As another example, an extended transmission protocol CM configuration (e.g., CM-xTCP) may be provided wherein the CM uses HTTP on top of an extended form of a TCP connection (referred to herein as xTCP). Such an extended transmission protocol may provide operation adapted to facilitate enhanced delivery of fragments by TA 120 according to the concepts herein. For example, an embodiment of xTCP provides acknowledgments back to the server even when sent packets are lost (in contrast to the duplicate acknowledgement scheme of TCP when packets are lost). Such a xTCP data packet acknowledgment scheme may be utilized by TA 120 to avoid the server reducing the rate at which data packets are transmitted in response to determining that data packets are missing. As still another example, a proprietary protocol CM configuration (e.g., CM-rUDP) may be provided wherein the CM uses a proprietary User Datagram Protocol (UDP) protocol and the rate of sending response data from a server may be at a constant preconfigured rate, or there may be rate management within the protocol to ensure that the send rate is as high as possible without undesirably congesting the network. Such a proprietary protocol CM may operate in cooperation with proprietary servers that support the proprietary protocol.

It should be appreciated that, although the illustrated embodiment has been discussed with respect to CM 122 requesting data from a source file from server 130, the source files may be available on servers or may be stored locally on the client device, depending on the type of interface the CM has to access the data.

Further, in accordance with embodiments, client device 110 may be able to connect to one or more other devices (e.g., various configurations of devices disposed nearby), referred to herein as helper devices (e.g., over a WiFi or Bluetooth interface), wherein such helper devices may have connectivity to one or more servers, such as server 130, through a 3G or LTE connection, potentially through different carriers for the different helper devices. Thus, client device 110 may be able to use the connectivity of the helper devices to send chunk requests to one or more servers, such as server 130. In this case, there may be a CM within TA 120 to connect to and send chunk requests and receive responses to each of the helper devices. In such an embodiment, the helper devices may send different chunk request for the same fragment to the same or different servers (e.g., the same fragment may be available to the helper devices on multiple servers, where for example the different servers are provided by the same of different content delivery network providers).

In some embodiments, redundant encoded content data files (e.g., FEC encoded data files) that contain repair symbols generated using redundant encoding techniques from the matching source files may also be made available (e.g., upon one or more content servers). There may, for example, be one such file for each source file, wherein each redundant encoded content data file is generated from the source file using redundant encoding techniques, such as FEC encoding techniques, known in the art. In such an embodiment, content file 141 may comprise a low bitrate (low resolution) version of the content, content file 142 may comprise a high bitrate (high resolution) version of the content, and content file 143 may comprise a FEC encoded version of content file 142, for example. Although implementations of redundant encoded data transmission, where all the data transmitted is encoded for error correction, may not provide significant benefits for some streaming use cases, the use of such redundant encoded content data (e.g., for expediting transfer of content data lost in a previous transmission) according to the concepts herein can be advantageous for many streaming use cases. For example, for live streaming there is often a requirement that there is a small time interval between when content is generated, made available, or created, and when that same content is available for playback and viewing on client device 110. For example, the time interval may be 1 second or less. Accordingly, as described in further detail below, some of the chunk requests made by RM 121 to CM 122 may be for redundant encoded content data.

Consistent with the foregoing, there may be various configurations of RMs according to embodiments, such as may comprise a basic RM configuration (RM-basic) which does not use redundant encoded content data and thus only requests portions of data from the original source fragments and a redundant encoded content data RM configuration (RM-FEC) which can request portions of data from the original source fragments as well as matching redundant encoded content data fragments generated from the source fragments. Embodiments of RM 121 adapted for redundant encoded content data may thus decode such data received from CM 122 using an appropriate redundant encoded content data decoding (e.g., FEC decoding) technique to recover the fragment, or some portion thereof. RM 121 may thereafter deliver recovered fragments to UA 129.

As will be more fully understood from the discussion which follows, TA 120 of embodiments utilizes redundant encoded content data requests to help to recover fragments, wherein the total amount of data to request for any fragment and when to request redundant encoded content data for any fragment may vary and depend on factors such as how much and which data has already been received for the fragment. That is, rather than utilizing the redundant encoded data for correcting corrupted data resulting from the data transmission, as is typical, embodiments utilize redundant encoded data as additional data to expedite recovery of requested fragments, such as where requested data units (e.g., fragments, chunks, packets, etc.) are lost or delayed. In operation according to embodiments, the amount of redundant encoded data requested (or whether any redundant encoded data is requested) with respect to any particular fragment is controlled based upon a need for such redundant encoded data to speed up delivery and recovery of the fragment. For example, if there is not a high level of late data being received in response to fragment requests a low amount of redundant encoded data may be requested in addition to the requests for non-redundant encoded data of the fragment requests.

Logic of TA 120 may automatically determine how much redundant encoded content data to use for any fragment (including no redundant encoded content data). For example, RM 121 may automatically tune the amount of redundant encoded content data requested to the amount of redundant encoded content data needed to recover each fragment in a timely fashion. In operation according to embodiments, the amount of redundant encoded data requested by RM 121 for any particular chunk may depend upon the total amount of late data experienced during the course of downloading the fragment. As the logic for requesting and decoding redundant encoded content data is implemented by the transport accelerator (e.g., RM 121) of embodiments, any configuration of UA 129 (i.e., even those not adapted for use of redundant encoded content data) can use the automated RM FEC methods without any redundant encoded content data semantics or logic (e.g., the UA need not have knowledge of whether FEC data is available in order for the automated RM FEC methods to operate to utilize FEC data when such FEC data is available). A transport accelerator of embodiments (e.g., through cooperation of a RM and CM thereof) may operate to automatically decide whether or not, when, and how much redundant encoded content data to use, such as for each fragment or sequence of fragments.

Detail with respect to embodiments of a system adapted according to the concepts herein to provide accelerated transfer of content using redundant encoded content data is provided below. It should be appreciated that, although FEC encoded data is referenced as exemplary redundant encoded content data in order to provide specific examples which are easier for the reader to understand, the concepts herein are applicable with respect to any number of suitable redundant encoded content data types. For example, error-correction may be used in place of or in addition to Forward Error Correction used at the application level to protect against packet loss. As another example, each fragment may be made available to request in reverse order, instead of only in the usual forward order, in which cases chunk requests can be made from the end of the fragment towards the beginning in addition to the usual request sequence from the beginning to the end, and then the fragment is recoverable as soon as the fragment recovery in the reverse order meets the fragment recovery in the forward order, possibly with some overlap of data requested in the two request orders.

Embodiments of TA 120 may operate to utilize FEC data with respect to any or all fragments of content requested. How much extra data beyond the size of a fragment, F, may be requested for a fragment according to embodiments may be provided as a predetermined amount (e.g., default amount used for all fragments or for those fragments for which an amount of extra data has not otherwise been specified), may be dynamically determined (e.g., depending on current network conditions), etc. . . . In operation according to embodiments, information regarding the amount of FEC data to use for each fragment, and a corresponding FEC fragment containing FEC data, may be provided by the UA to the RM. Accordingly, UA 129 and/or TA 120 (e.g., RM 121) may be adapted for utilizing FEC data according to embodiments of the present disclosure.

As can be appreciated from the foregoing, in an alternative to a basic RM configuration, RM 121 of embodiments may be adapted to use FEC data to help to recover fragments. For example, a configuration of RM 121 may implement a FEC data technique referred to herein as RM-fixed-FEC whereby the amount of FEC data to use for each fragment, and a corresponding FEC fragment containing FEC data, is provided by the UA to the RM.

Accordingly, signaling between UA 129 and RM 121, such as to provide information about the FEC fragment matching the original source fragment being requested, signaling of an urgency factor (X), etc., may be utilized according to embodiments. In operation according to embodiments of TA 120 adapted to use FEC data, UA 129 provides RM 121 with a source fragment request, a matching FEC fragment request, and an urgency factor X (e.g., with a specified value) that controls how aggressively the RM requests data beyond the minimal needed to recover the source fragment, as described in more detail below. In response, RM 121 of embodiments provides just the source fragment data to UA 129, not the matching FEC fragment data. UA 129 of such embodiments provides RM 121 with the matching FEC fragment request and the urgency factor so that the RM can use this information to help accelerate the delivery of the source fragment request. In a variation on the foregoing, UA 129 operable with TA 120 adapted to use FEC data may provide RM 121 with only source fragment requests, and the RM may derive the corresponding matching FEC fragment requests automatically, and the RM may compute how much FEC to request for each fragment automatically, as described in more detail below. It should be appreciated that, in either of the foregoing configurations, RM 121 is the only component of client device 110 that needs to understand the semantics of FEC, including providing FEC decoding.

Figure 2:
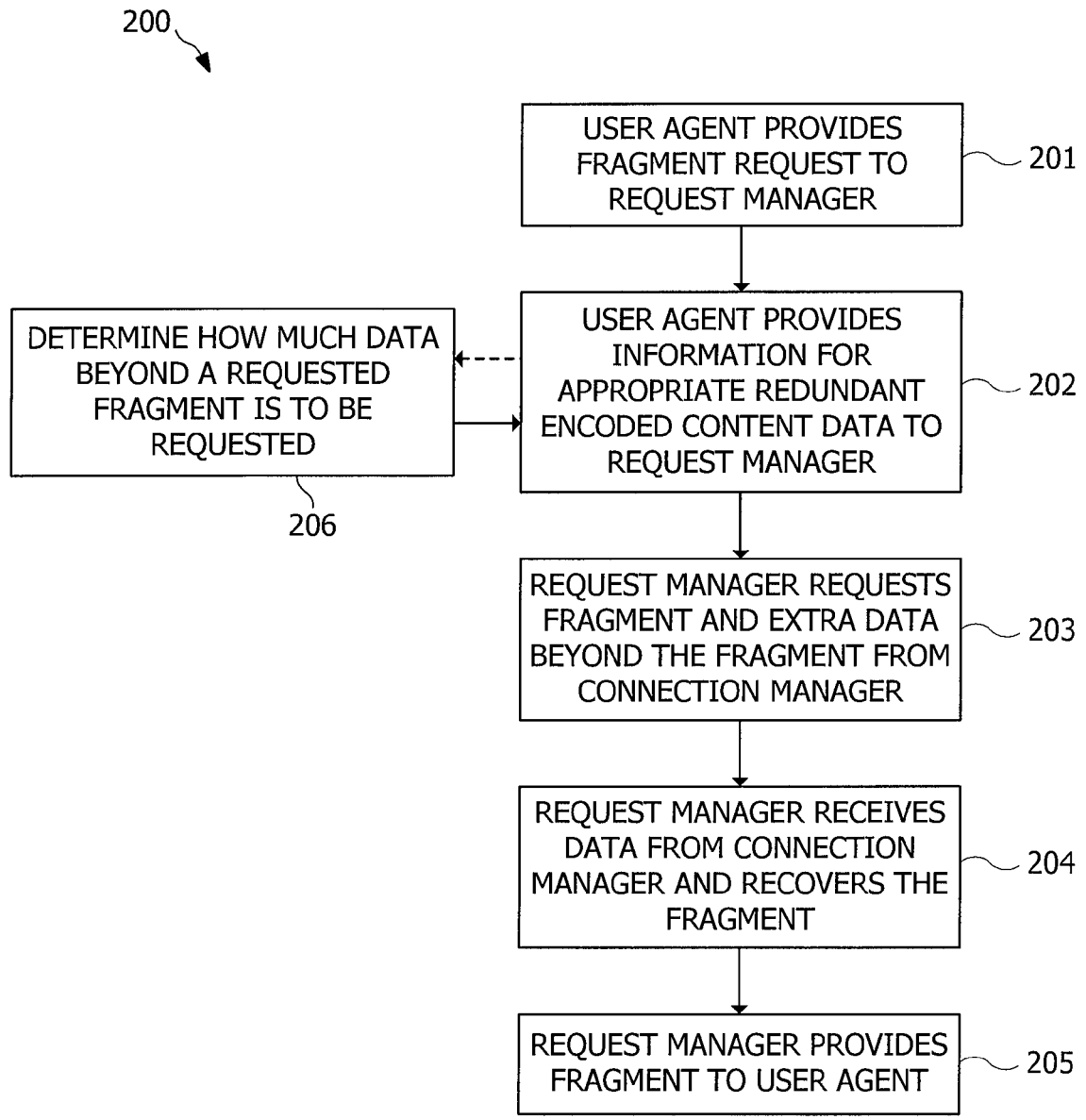
FIG. 2 shows a flow diagram illustrating operation of a fixed redundant encoded content data configuration Request Manager of a Transport Accelerator of embodiments of the present disclosure.

Operation in accordance with a RM-fixed-FEC technique of embodiments is shown in FIG. 2 as flow 200. In understanding operation of a RM-fixed-FEC technique of embodiments, assume that a request for fragment F has just been made by the UA (block 201), and thus F is initially active and eligible. UA 129 of the illustrated embodiment further provides RM 121 with information for requesting an amount of FEC data in association with the fragment request (block 202). Such information may comprise identification of a source of FEC data corresponding to the content data of the requested fragment as well as other information for the use of FEC data by RM 121.

It should be appreciated that what the fragments are and how they are identified is generally specific to the UA. However, in general the fragments are media files or binary files, or byte ranges of such files, that are identified by resource identification information (e.g., URL, URI, or URN) and possibly a byte range, such as may be requested using the HTTP protocol or like protocols. Accordingly, in operation according to embodiments, UA 129 supplies the resource identification information (e.g., URL), the associated byte range, and the fragment size to RM 121. Similarly, UA 129 may supply the resource identification information, the associated byte range, fragment size, and symbol size for a corresponding FEC fragment. For example, a matching FEC fragment, R, and the symbol size, T, in bytes are provided by UA 129 to RM 121 in association with the request for the fragment, F, and UA 129 may also provide RM 121 with the size in bytes, FB, of fragment F, and with the size in bytes, RB, of FEC fragment R. The data request sizes of embodiments are preferably, but not limited to, multiples of T bytes, except for the request for the last portion of F when FB is not a multiple of T. In some cases it may not be possible to make data requests that are multiples of T bytes, for example, when requests are to be made before the value of T is known. In these cases, as described herein, the value of T is typically chosen so that reception of partial symbols due to requests or responses to requests that are not aligned on symbol boundaries is only a small portion of the data received.

When UA 129 is a DASH client, the generation of FEC files may be provided using techniques as shown and described in U.S. patent application Ser. No. 12/887,495 entitled "ENHANCED BLOCK-REQUEST STREAMING USING COOPERATIVE PARALLEL HTTP," the disclosure of which is hereby incorporated herein by reference. In such embodiments, the logic of how these FEC files are generated are particular to the DASH client. Accordingly, UA 129 of embodiments may supply information to RM 121 regarding the logic used in generating the FEC files, whereby the RM does not need to independently know about this logic. For example, the resource identification information provided by UA 129 to RM 121 for a matching FEC fragment may comprise the URL for the fragment with the suffix ".raptorq.$T$" appended, where "raptorQ" indicates that the FEC code is the RAPTORQ code specified in Internet Engineering Task Force (IETF) RFC 6330 and the value of "$T$" is the symbol size used to encode the matching FEC fragment from the fragment. As another example, the value of T may be determined automatically for each fragment based on the size of the fragment FB.

In operation according to a RM-fixed-FEC technique of embodiments, UA 129 additionally or alternatively provides the aforementioned urgency factor, X, used in determining (block 206) how much extra data beyond the size of the requested fragment, F, is to be requested for a fragment by RM 121 (also at block 202). The value for the urgency factor may be determined in various ways, and may be determined contemporaneous with the fragment request, prior to the fragment request, prior to a streaming content session for which the fragment request is made, etc. For example, a predetermined default value for X (e.g., X=0.1) may be used for some fragments (e.g., fragments for which no value of X is otherwise provided) or for all fragments. In operation according to embodiments, logic of UA 129 is adapted to determine the value of the urgency factor, X, for use with respect to some or all fragment requests. For example, values of the urgency factor as may be utilized according to embodiments of the present disclosure may be determined using algorithms as described in U.S. Pat. No. 7,447,235 entitled "FEC BASED RELIABILITY CONTROL PROTOCOLS," the disclosure of which is hereby incorporated herein by reference.

An appropriate amount of FEC data beyond the data of the requested fragment may be requested by RM 121 (block 203) using the foregoing urgency factor, X. For example, RM 121 may make one or more chunk requests having the additional data requested in association therewith, such as in response to signaling readiness for another request by CM 122, at a point in time RM 121 deems appropriate to make a request, etc. Likewise, RM 121 may make a separate request for some or all of the additional data to CM 122, such as in response to signaling readiness for another request by CM 122, at a point in time RM 121 deems appropriate to make a request, etc.

It should be appreciated that the fragments requested by UA 129 may be subdivided into smaller requests (e.g., the aforementioned chunk requests) when made by RM 121 to CM 122 and/or when made by CM 122 to server 130. The amount of additional data requested with respect to a particular fragment may thus be an aggregate amount of additional data with respect to the chunk requests of that fragment request (i.e., some portion of the additional data may be requested in association with any or all chunk requests for a fragment). Likewise, the additional data requested may comprise one or more requests for FEC data in addition to or instead of the chunk requests for data from the original content fragment. For example, all data requests may be for FEC data only, whether or not the amount of overall data requests is the size of the fragment or more than the size of the fragment.

An embodiment of RM 121 implementing a RM-fixed-FEC technique may, for example, request a total of (1+X)·FB bytes for the fragment F. Thus, an additional X·FB bytes of data may be requested from the FEC fragment, R (e.g., after all of the data from the fragment, F, has been requested). Where RM 121 does not use FEC, embodiments may set T=1 and X=0 to nullify the RM-fixed-FEC technique operation.

In operation according to embodiments of a RM-fixed-FEC technique herein, how much extra data is requested beyond the size of a fragment, F, may vary dynamically (e.g., as determined at block 206), such as to depend on current network conditions. The extra amount of data may, for example, be a function of the bandwidth-delay product according to embodiments. For example, if the current download rate is DR and the current round-trip time is RTT, then the extra amount of data beyond F requested may be X·DR·RTT, where X may be a fixed fraction (e.g., X=½ or X=0.29) according to this embodiment. As an approximation of the foregoing, the extra amount of data allowed to be requested can be set to X·Recwindow, where Recwindow is the current TCP-receive window size, or a measure of how many octets (bytes) or data on average have resided in the TCP receive buffer at the client device, or aggregate of all the TCP-receive window sizes or average aggregate byte occupancy of TCP receive buffers in case of using multiple TCP connections, when CM 122 uses TCP as its underlying transport protocol. In such embodiments, CM 122 may signal these parameters to RM 121 (e.g., the CM may provide the RM with the current estimates of DR and RTT, or the current estimate of Recwindow).

It should be appreciated that various alternatives may be utilized in providing RM-fixed-FEC techniques without deviating from the concepts herein. For example, although embodiments have been described above wherein the UA operates to determine (e.g., at block 206) an amount of FEC data to be used with respect to requested fragment (e.g., using the aforementioned urgency factor), other components of a system adapted according to the concepts herein to provide accelerated transfer of content using redundant encoded content data may operate to determine an amount of FEC data to be used. As an example of an implementation where a component other than the UA operates to determine an amount of FEC data to be used, the CM of embodiments may determine and signal schunk, where schunk is a target data chunk request size that is suitable for the CM, for each chunk request. The CM may base schunk on the amount of data that a TCP sender may be allowed to send at one time after receiving the chunk request, where in this case the value of schunk may be based on an estimate of the current TCP congestion window size for that TCP connection at the time the chunk request will be received by the TCP sender. The value for schunk may thus be utilized by the RM in establishing the size of each chunk of data that may be requested in association with a fragment request.

It should be appreciated that one or more parameters of the information for appropriate redundant encoded content data may additionally or alternatively be utilized (e.g., by RM 121) in determining how much data beyond a requested fragment is to be requested. Accordingly, the embodiment of flow 200 illustrated in FIG. 2 includes an optional data path between blocks 202 and 206 whereby such information may be passed for use in one or more determinations as described herein.

Pseudo code showing detail for implementing a robust RM-fixed-FEC technique for fragment F, using FEC fragment R, using parameters as may be provided to RM 121 by UA 129 and CM 122 according to embodiments is provided below:

```
Initialization when F is first requested by the UA
        Set status of F to be active and eligible
        Obtain the value of T from the UA
                /* The symbol size T should be set so that the number of source symbols
in the           fragment is in the range 100 and 10,000. If FEC is not used then T = 1 */
        Obtain the value of schunk from the CM
                /* schunk is the target number of bytes per data request – the data request
size in          bytes may be set independent of the fragment size, e.g., schunk is set to
16               kilobytes independent of the fragment size */
        nsym = ceil(schunk / T)
                /*nsym is the target number of symbols per request – a data request size
                    nsym x T in bytes is approximately schunk */
        RK = 0
                /* RK is the number of symbols received for fragment F from the CM */
        UK = 0
                /* UK is the number of symbols requested from the CM that have not yet
been             received, and have not yet been acknowledged that they won't be
delivered, i.e.,    whether or not and when they will be delivered is currently
unknown */
        QK = 0
                /* QK is the total number of symbols requested from F so far */
        QK' = 0
                /* QK' is the total number of symbols requested from R so far */
        When size FB of fragment F is determined /* FB may be provided by the UA, or
        may come back in a response to data requests for portions of fragment F */
                K = ceil(FB / T)
                /* K is the number of source symbols into which the source data of F is
                    partitioned into for purposes of FEC encoding and decoding. The
size FB of F     may only be known after some data of F or R has been received,
and thus the     value of K may not be known initially */
        When size RB of FEC fragment R is determined /* RB may be provided by the
UA, or may come back in a response to data requests for portions of fragment R */
                K' = floor(RB / T)
                /* K' is the number of repair symbols in R. The size RB of R may only
be known after some data of F or R has been received, and thus the value       of K'
may not be known initially */
        XK = ceil(X · FB / T)
                /* The value of X may be set by default, e.g., X = 0.1, or the value of X
may be provided by the UA. XK is the number of additional symbols
beyond K that can be requested at any point in time */
if CM indicates time to request and F is the earliest active and eligible fragment   then
        if not all of fragment F has been requested then
                if value of FB has not yet been determined then
                        dK = nsym /* dK is the number of symbols to request
                of F*/
                elseif the value of FB has been determined then
                        remK = K – QK /* remK is no. src symbols not yet
                requested */
                        if (remK ≤ nsym) then
                                dK = remK */ request all remaining source symbols */
                        elseif (remK ≤ 2·nsym) then
                                dK = ceil(remK / 2) /* request half – the remainder will be
requested in the next request */
                        else /* remK > 2- ·nsym */
                                dK = nsym /* request target number of symbols */
                Request bytes [QK x T, ..., min{QK · T + dK·T, FB} – 1 of F
                QK = QK + dK
                UK = UK + dK
        If all of fragment F has been requested /* Request from repair fragment R */
                remK' = K +XK – RK – UK /* remK' > 0 since F is eligible */
                If (K' – QK' > 0) /* there are symbols left to request in R */
                        dK = min{K' – QK', nsym, remK'}
                        Request bytes [QK' ·T, ..., (QK' + dK) · T – 1] of R
                        QK' = QK' +dK
                        UK = UK + dK
                        If (K + XK – RK – UK ≤ 0) then change status of F to
                                ineligible
                        Else "error recovery" /* there are no more symbols to request and
```

```
            more             are needed to recover, probably re-request some missing symbols
            in this          case */
                    If CM indicates that L requested not yet received symbols for F will fail to be
            delivered
                        UK = UK − L
                        If (K + XK − RK − UK > 0) then set status of F to eligible
                    If CM delivers L symbols for fragment F
                        RK = RK + L
                        UK = UK − L
                        If (RK ≥ K)
                            If enough symbols have been received to recover F then
                                FEC decode F from the received symbols and respond
                                with F to the UA /* Typically K, K-+-1 or K-+-2 symbols
                                with RAPTORQ encoding */
                                Change status of F from active to recovered
```

Having determined an amount of data beyond the fragment data (block 206) and made the fragment and extra data request (block 203), as appropriate, RM 121 operating in accordance with a RM-fixed-FEC technique herein may receive content data of the requested fragment as well as FEC data beyond the requested fragment (block 204). It should be appreciated that the operations described in FIG. 2 potentially involve performing partial steps associated with a block interwoven in time with other partial steps from other blocks. For example, performing partial sub-steps of block 206 may be interwoven in time with performing partial sub-steps of blocks 203, 204 and 205.

Although requesting FEC data beyond the data of a requested fragment may increase the amount of data transferred over the network, the various packets of data may arrive at different times (e.g., some data packets may be delayed, while other data packets are delivered more timely). Various combinations of the requested fragment data and the FEC data may be used to recover the fragment. Accordingly, embodiments of RM 121 implementing a RM-fixed-FEC technique herein may recover the fragment using the earliest received data (whether the fragment data or combination of fragment data and FEC data) sufficient to provide for recovery of the fragment. The fragment may thus be recovered by RM 121 expeditiously and provided to UA 129 for consumption of the content (block 205).

Additionally or alternative, the RM of embodiments may be adapted to automatically determine how much FEC data to use with respect to the requested fragments. Accordingly, in an alternative to a RM-fixed-FEC configuration, RM 121 of embodiments may be adapted to not only use FEC data to help to recover fragments but to automatically determine how much FEC to use with respect to the fragments thereby providing a configuration of RM 121 implementing a FEC data technique referred to herein as RM-auto-FEC. Implementation of a RM-auto-FEC technique may be desirable over a RM-fixed-FEC technique in some situations for a number of reasons. In particular, the RM-auto-FEC techniques of embodiments automatically tunes the amount of FEC data requested to the amount of FEC data needed to recover each fragment. Thus, the amount of data that is downloaded for a fragment is minimized, generally requiring less overall downloaded data on average than for RM-fixed-FEC when the amount of FEC to use is determined by the UA. The timely delivery of the requested fragments may be maximized using RM-auto-FEC while generally providing as good or better timely delivery than for RM-fixed-FEC. Moreover, because the amount of FEC data to request is automatically determined by the RM, the UA does not need to specify the amount of FEC to use or incorporate any FEC logic. This simplifies and reduces the requirements on the UA, and generally makes the RM-auto-FEC methods more broadly applicable to different UA configurations (e.g., including UA configurations that do not include any FEC logic, whether to request or decode FEC data).

Figure 3:
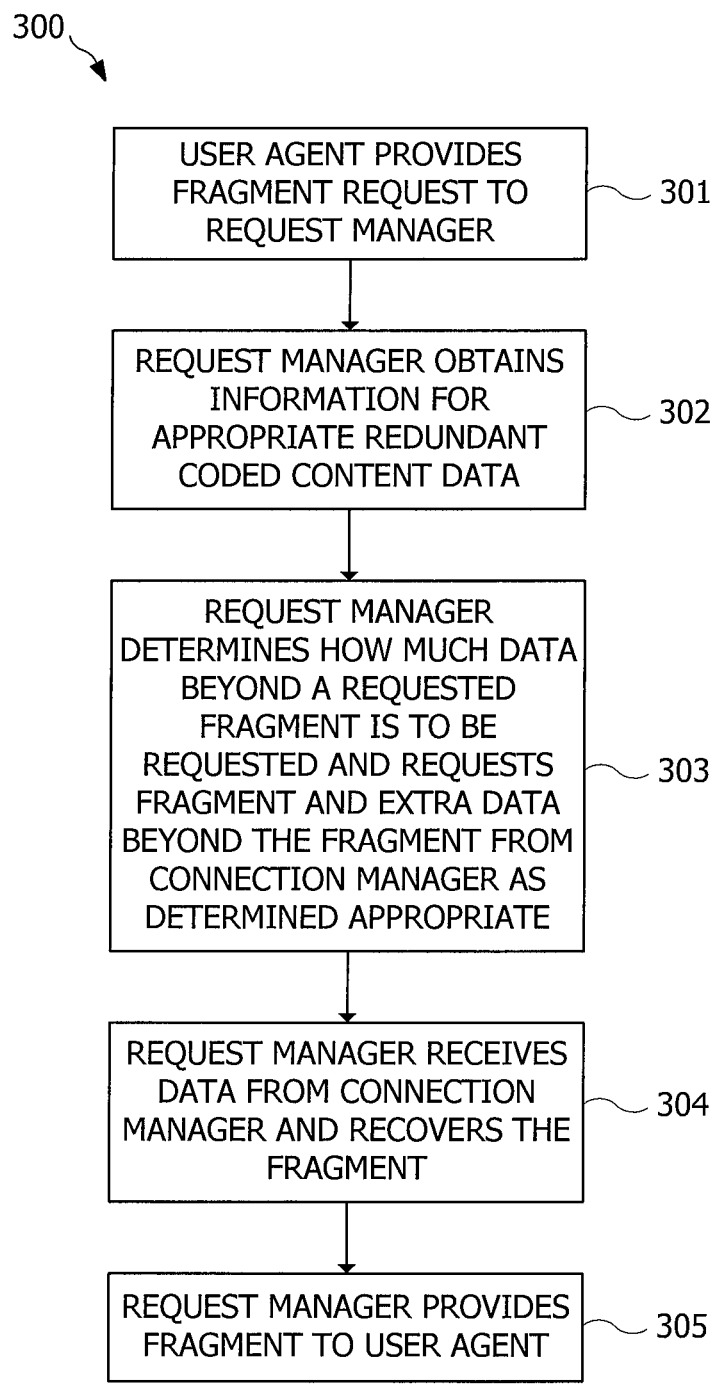
FIG. 3 shows a flow diagram illustrating operation of an auto redundant encoded content data configuration Request Manager of a Transport Accelerator of embodiments of the present disclosure.

Operation in accordance with a RM-auto-FEC technique of embodiments is shown in FIG. 3 as flow 300. To aid in understanding the concepts of RM-auto-FEC techniques of embodiments herein, the RM-auto-FEC techniques are described as an extension of the discussion of RM-fixed-FEC techniques provided above. Accordingly, as with the RM-fixed-FEC techniques described above, for the RM-auto-FEC techniques described herein it is assumed that a request for fragment F has just been made by UA 129 (block 301), and thus F is initially active and eligible.

In operation according to the illustrated embodiment, RM 121 obtains information for the use of an appropriate amount of redundant encoded content data in association with the fragment request (block 302). Such information may comprise identification of a source of FEC data corresponding to the content data of the requested fragment as well as other information for the use of FEC data by RM 121. For example, information regarding a matching FEC fragment, R, and the symbol size, T, may be available or otherwise determinable when the request for fragment F is provided to RM 121. Although UA 129 may provide (e.g., at block 301) RM 121 with some information useful with respect to the use of FEC data, RM 121 of embodiments may operate to determine or otherwise obtain information for utilizing FEC data. For example, UA 129 may provide FB, which is the size in bytes of fragment F, while the size in bytes RB of a corresponding FEC fragment, R, may automatically be derived from FB by the RM (e.g., using techniques as shown and described in U.S. patent application Ser. No. 12/887,495 entitled "ENHANCED BLOCK-REQUEST STREAMING USING COOPERATIVE PARALLEL HTTP," the disclosure of which is hereby incorporated herein by reference).

Alternatively, the value of FB may be obtained in response to a request for at least a portion of F or R. The size T of symbols to use to FEC encode and FEC decode F may be determined automatically from the size FB of F. For example, deriving T as T=max {4, floor(FB/2,048)} at both the FEC encoder and DEC decoder ensures that the same symbol size is used to encode and decode and that the number of source symbols into which F is partitioned is at least 2,048 if FB is at least 8 Kilobytes. This may ensure that there is at most 0.1% of wastage in received data in each response to receiving data due to receiving partial symbols that may not be useful for FEC decoding. For example, the response to a chunk request for a byte range of F may comprise at most two partial symbols in the response (one at the beginning of the response, one at the end, wherein all the intermediate response data comprises full symbols) that may not be useful for FEC decoding if the remainder of these partial symbols are not received in other responses, and the 2 wasted partial symbols per response comprise at most 2/2,048=0.1% of fragment F, if FB is at least 8 Kilobytes.

The URL for the FEC fragment R, or other information suitable for identifying and accessing FEC data, may be automatically generated by RM 121 without requiring any input from UA 129 according to embodiments. As in the embodiments discussed above, the data request sizes may be made multiples of T bytes, except for the request for the last portion of F when FB is not a multiple of T, or until the symbol size T is known, for example T is determined based on FB once FB is determined in response to a data request sent for fragment F. Where RM 121 does not use FEC, embodiments may set T=1, until the value of T is known. As an alternative, all requests may be made that are not based on T-byte alignment, i.e., effectively T=1 is used for all data requests, and then the data received in responses is internally partitioned into symbols by the RM 121 for the purposes of FEC decoding, if FEC decoding is used to recover the fragment.

In operation according to a RM-auto-FEC technique herein, RM 121 operates to dynamically and automatically determine how much data beyond a requested fragment to request (block 303). Such determinations are made at or near a time of the fragment request to thereby dynamically provide determinations with respect to the extra data that are timely with respect to network conditions and/or other circumstances relatively contemporaneous with the fragment request. Embodiments, however, may additionally or alternatively operate to make such determinations at other times, as determined to be desirable. It should be appreciated that one or more parameters of the information for appropriate redundant encoded content data may be utilized by RM 121 in dynamically determining how much data beyond a requested fragment is to be requested.

Embodiments of a RM-auto-FEC technique herein implement one or more processes for determining how much data beyond a requested fragment is to be requested which is the same or similar to those implemented a RM-fixed-FEC technique (e.g., using a predetermined default value, factor X, varied depending upon network conditions, etc.) discussed above. The condition for when such additional data is to be requested for a fragment in accordance with a RM-auto-FEC technique of embodiments may be different than that of a RM-fixed-FEC technique. In particular, embodiments of RM-fixed-FEC techniques operate to uniformly request data beyond that of the requested fragment (e.g., request such additional data for each fragment), whereas embodiments of a RM-auto-FEC technique operate to dynamically determine when and how much data beyond that of a the requested fragment is to be requested (e.g., request such additional data based upon network conditions).

RM 121 of embodiments may request fragment data (e.g., as one or more chunk requests) and, when determined appropriate, RM 121 may request extra data beyond the fragment data from CM 122 (block 303). In operation according to a RM-auto-FEC technique of embodiments, a determination regarding when and how much data in addition to the requested fragment is to be requested depends at least in part on network conditions (e.g., a measure of the amount of late data and/or the lateness of data requested over the network).

In accordance with an exemplary process for RM 121 of embodiments to dynamically and automatically determine when it is appropriate to request additional data with respect to any particular fragment, and how much such data to request. An ordering of the data requests from RM 121 to CM 122 is defined for use in identifying delayed or late data packets. For example, an ordering of the data requests from the RM to the CM may be defined as the order that the RM requests the data from the CM, whereby the earlier requested chunks of data are earlier in the ordering than subsequent requests for chunks of data. In such an embodiment, the ordering of the data within a chunk request may be defined as the natural ordering (i.e., the first bytes of the chunk request are earlier in the ordering than subsequent bytes of the chunk request).

Using the foregoing ordering of data, RM 121 of embodiments may operate to deem a first portion of data late (and possibly lost) if the RM has requested the first portion of data but it still has not yet been received when a second portion of data is received that was requested by the RM after the first portion of data was requested. For example, for a portion of data that has been requested by the RM but not yet received: Define the portion of data as "pending" if no data requested subsequent to that portion of data has yet been received by the RM; and Define the portion of data as being acknowledged as "late", if there has been data requested subsequent to that portion of data that has been received by the RM.

In addition to the variables defined above with respect to the RM-fixed-FEC technique, the variables PK, which is the amount of data that is pending for the fragment, and LK, which is the amount of data that is late for the fragment, may be defined for use with respect to a RM-auto-FEC technique of embodiments herein. From the foregoing, it can be appreciated that UK, which is the total amount of requested but unacknowledged data for the fragment, may be expressed as UK=PK+LK. The variable RK, which is the amount of data received for the fragment (if the exact same data is received twice for a fragment it is only counted once in RK), may further be defined for use with respect to the RM-auto-FEC technique of embodiments. For the examples provided herein, all of the foregoing amounts are assumed to be measured in units of symbols, although other units (e.g., measuring the amounts of data in bytes or octets) may be utilized according to embodiments.

Additionally, RM 121 of embodiments may keep track of the maximum amount of late data seen at any point in time for a fragment (e.g., a variable maxLK can be initialized to zero and then maxLK=maximum{LK, maxLK} may be recalculated each time the value of LK changes for a fragment). Such a fragment maximum late data variable may, for example, be utilized to moderate the potentially highly variable nature of the lateness variable, LK, according to embodiments. As an alternative, maxLK may be defined as the maximum amount of late data at any point in time over some previous window of S of fragments, where S is a configurable parameter, e.g., S=10. As another variant, the window over which the maximum is calculated may be over a configurable duration of previous time, or over a duration of previous time that depends on other measurements such as the RTT, or over a configurable number of previous chunk requests. As another alternative, the value of LK may be maintained independent of the underlying fragment structure, e.g., based on the ordering of chunk requests made by the RM independent of from which fragment each chunk request is generated.

In operation according to embodiments, each time RM 121 receives data for the fragment, the value of RK is increased by the amount of data received (as long as it is not the exact same data received previously for the same fragment), the value of UK is decreased by this amount, the value of PK is decreased by the amount of this data that was previously pending, and the value of LK is decreased by the amount of this data that was previously late. Also, when data is received by RM 121, if there is previously requested data that is still pending, this previously requested data is reclassified from being pending to being late, and the size of this previously requested data is subtracted from PK and added to LK.

Figure 4:
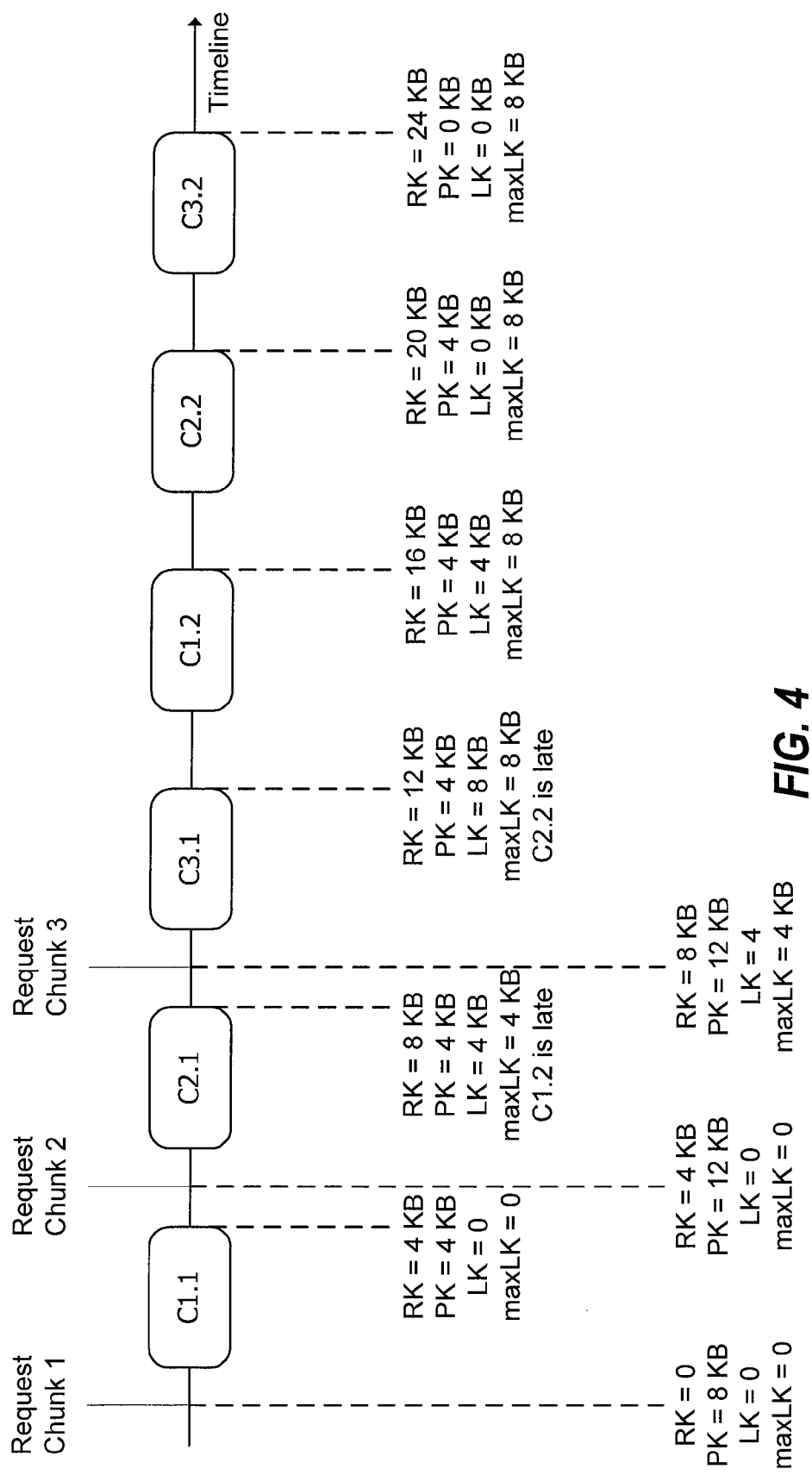
FIG. 4 shows a timeline illustrating received, pending and late data according to embodiments of the present disclosure.

FIG. 4 shows a timeline illustrating received, pending and late data and the corresponding values of the foregoing variables. In the timeline of FIG. 4, RM 121 makes requests for data chunks of a fragment to CM 122, first making a request for data chunk 1 (C1), then making a request for data chunk 2 (C2), and then making a request for data chunk 3 (C3). In the illustrated example, each of the data chunks is 8 KB in size, and each data chunk is received in two discrete pieces of 4 KB each (the notation Ci.j is used to indicate the jth piece of data chunk i). It should be appreciated that the information shown below the timeline of FIG. 4 illustrates when the values of RK, PK, LK, and maxLK change due to either new requests by the RM for data chunks or reception of data by the RM for previously requested chunks.

As shown in the scenario represented in FIG. 4, when RM 121 requests data chunk 1 (C1), RK=0 (because no data has yet been received), PK=8 KB (because data chunk 1 of size 8 KB is now pending), LK=0 (because no data is late yet), and maxLK=0. At the point on the timeline just after a first piece of data chunk 1 (C1.1) is received by RM 121, RK=4 KB (because C1.1 has been received), PK=4 KB (because C1.2 is now pending), LK=0 (because no data is late yet), and maxLK=0. When RM 121 requests data chunk 2 (C2), RK=4 KB (because C1.1 has been received), PK=12 KB (because C1.2, C2.1, and C2.2 are pending), LK=0 (because no data is late yet), and maxLK=0. At the point on the timeline just after a first piece of data chunk 2 (C2.1) is received by RM 121, RK=8 KB (because C1.1 and C2.1 have been received), PK=4 KB (because C2.2 is still pending), LK=4 KB (because the arrival of C2.2 triggers C1.2 to be late), and maxLK=4 KB. When RM 121 requests data chunk 3 (C3), RK=8 KB (because C1.1 and C2.1 have been received), PK=12 KB (because C2.2 is still pending, and also now C3.1 and C3.2 are pending), LK=4 KB (because C1.2 is still late), and maxLK=4 KB. At the point on the timeline just after a first piece of data chunk 3 (C3.1) is received by RM 121, RK=12 KB (because C1.1, C2.1 and C3.1 have been received), PK=4 KB (because C3.2 is pending), LK=8 KB (because now both C1.2 and C2.2 are late), and maxLK=8 KB. At the point on the timeline just after a second piece of data chunk 1 (C1.2) is received by RM 121, RK=16 KB (because C1.1, C1.2, C2.1 and C3.1 have been received), PK=4 KB (because C3.2 is pending), LK=4 KB (because now only C2.2 is late), and maxLK=8 KB. At the point on the timeline just after a second piece of data chunk 2 (C2.2) is received by RM 121, RK=20 KB (because C1.1, C1.2, C2.1, C2.2 and C3.1 have been received), PK=4 KB (because C3.2 is still pending), LK=0 KB (because C2.2 has now arrived and there is no other late data), and maxLK=8 KB. At the point on the timeline just after a second piece of data chunk 3 (C3.2) is received by RM 121, RK=24 KB (because C1.1, C1.2, C2.1, C2.2, C3.1 and C3.2 have been received), PK=0 KB (because there no pending data), LK=0 KB (because there is no late data), and maxLK=0 KB.

It should be appreciated that, although in the above example all the data chunks were for a single fragment, the concepts represented apply to multiple fragments. For example, when there are multiple fragments, the values of RK, UK, PK, LK, and maxLK may be maintained per fragment, or alternatively may be maintained based on chunk requests independent of the fragments from which the chunk requests are generated (e.g., calculated over a window of a configurable number of previous chunks or a window of a configurable number of previous bytes or a window of a configurable duration of previous time). However, if the RM requests a first data chunk for a first fragment and then the RM requests a second data chunk for a second fragment then arrival of pieces of the second data chunk can make not yet arrived pieces of the first data chunk to be classified as late by the RM.

Using the foregoing parameters, a determination regarding when a request for data (e.g., data of the requested fragment as well as data beyond the requested fragment) may be made and how much data to request. It should be appreciated that the additional data may be requested in combination with the request for fragment data (e.g., as part of or in association with a chunk request, whether an initial chunk request or a re-request for chunk data) or as a separate request for data (e.g., as an independent request for additional data or as an independent request in response to late or missing data). However, whenever RM 121 makes a request for a data chunk, there may be a minimum size data chunk specified (e.g., 4 KB, 8 KB, etc.), which may for example depend on the size of the fragment or on the value of schunk (schunk being a target data chunk request size that is suitable for CM 122).

In operation according to a basic RM-auto-FEC implementation, more data for any particular fragment may be requested by RM 121 (e.g., in block 303 of FIG. 3) in accordance with the foregoing network condition parameters as long as the condition RK+PK<K+XK is satisfied (i.e., another data chunk request can be made as long as the amount of data received or pending for the fragment is at most the size of the fragment plus XK). RM 121 may, for example set the value of XK independent of network conditions and the overall pattern of delivery of data to RM 121 by CM 122. For the RM-auto-FEC technique of embodiments, the value of XK may be set automatically to a small value by RM 121 (e.g., XK may be set to the minimum of $\{4\text{ KB}, 0.004\cdot K\}$, XK may be set to schunk, XK may be set to 0, etc.).

In operation according to a more robust RM-auto-FEC implementation, adding LK to each side of the foregoing inequality (recalling that UK=PK+LK), the condition can be written as RK+UK<K+XK+LK (i.e., another data chunk request can be made as long as the amount of data received or requested for the fragment is at most the size of the fragment, K, plus an additive constant number of bytes of the size of the fragment, XK, plus the amount of late data for the fragment, LK), whereby the value of LK provides how much extra data is allowed to be requested (e.g., in block 303) due to the amount of requested data that is late. In a variation of the foregoing, embodiments of a RM-auto-FEC implementation may provide operation in which RM 121 is allowed to request additional data for the fragment as long as the condition RK+UK<K+XK+$\alpha\cdot$LK is satisfied, where a is a suitably chosen constant (e.g., $\alpha=0.5$, $\alpha=1$, or $\alpha=3$). Using the maximum amount of late data seen at any point in time for a fragment, maxLK, in the foregoing condition may be utilized to moderate the potentially highly variable nature of the lateness variable LK. In such an embodiment, RM 121 may be allowed to request additional data for the fragment as long as the condition RK+UK<K+XK+$\alpha\cdot$maxLK is satisfied, where a is a suitably chosen constant (e.g., $\alpha=0.5$, $\alpha=1$, or $\alpha=1.5$). Alternatively, RM 121 may be allowed to request additional data for the fragment as long as the condition RK+UK<K+XK+ $a\cdot$FB$\cdot$maxLK/W is satisfied, where FB is the size of the fragment and W is the window of bytes over which maxLK is measured.

With respect to the foregoing, it should be appreciated that data that is classified as late, and thus the size of data counted in LK, is essentially data that is temporarily counted as late data. When pending data becomes late, the size of this data is subtracted from PK and added to LK, which may potentially allow for more data to be requested for this fragment according to particular conditions set forth above. However, as soon as any requested data that is late is received its size is added to RK and subtracted from LK, and thus any data that is classified as late for a short period of time will only be missing from RK+PK for this short period of time (only contributing to LK for this short period of time). In accordance with the foregoing conditions using LK, data received only somewhat late will contribute to LK for only a short duration of time, (e.g., if the data is first determined to be late at some time t and then the data arrives at time t+X then this data contributes to LK only during the period of time between t and t+X). For example, if X=RTT, where RTT is the current round trip time, then the data will only contribute to LK for an RTT. Thus, if DR is the current rate of receiving data, and data is only received at most one RTT out of order, then LK is at most DR·RTT at any point of time. Accordingly, the value of LK quantifies at any time how much extra data is allowed to be requested due to late data according to embodiments. In particular, in the foregoing embodiments implementing conditions using LK, the value of LK is the difference between how much extra data is allowed to be requested using a RM-auto-FEC technique compared to a RM-fixed-FEC technique due to automatic adjustment of the amount for requested data that is late.

If requested data is late for only short periods of time, even if most data is classified as late for at least some period of time until it is received (if it is ever received) and is thus received slightly out of order. The extra amount of data that is requested due to late data according to embodiments is generally small (i.e., the value of LK will generally be small). However, as the amount of time requested data remains late grows, there will be more outstanding requested but late data at each point in time and thus the value of LK generally will grow (i.e., when there is a more significant difference in the order of received data then the value of LK generally is larger) and thus, the amount of allowed requested data due to late data will grow. In operation according to embodiments, the more delayed the arrival of late data, the more impact that late data has on allowing additional requested data to be requested. If requested data is permanently lost, then the size of that data will remain as a contribution to LK from the time it is classified as late (or will remain over a window of time, or window of bytes, or window of chunks, or window of fragments, over which LK is calculated), and thereafter extra data will be thereafter allowed to be requested for this lost data according to embodiments.

The value of XK is generally set to a much smaller value for RM-auto-FEC techniques than for RM-fixed-FEC techniques, because it is serving a different purpose. For RM-fixed-FEC techniques of embodiments, the value of XK determines the amount of extra data that can be requested beyond what has been received (RK) or already requested but not yet received (UK). Accordingly, for such a RM-fixed-FEC technique, the value of XK is generally set according to considerations such as how much out of order data is expected to be received, how slow some of the data is going to arrive compared to other data, how much data is lost, etc. Thus, the value of XK is typically set using some additional information for the RM-fixed-FEC techniques (as shown in the pseudo code above). However, for RM-auto-FEC techniques of embodiments, accounting for out of order data, for some data arriving slower than other data, and for lost data, is provided for by the value of LK (the value of PK is smaller than the value of UK by the value of LK). Thus, the role of XK for RM-auto-FEC techniques of embodiments is to make sure that some data is requested beyond what is really needed to recover the fragment, in order to ensure that some of the last requested data for the fragment is classified as late if it is slow to arrive. That is, by requesting the last XK bytes of data, when it arrives any previously requested data that is arriving slow or lost, will then be classified as late, thus potentially triggering an additional request for this slow arriving or lost data. For this reason, the value of XK can be set to a small fixed value automatically for RM-auto-FEC techniques of embodiments.

In a situation where the RM is requesting a sequence of fragments, the RM 121 of embodiments may calculate statistics over multiple fragments that may be used by the RM to determine how much data to request for each fragment. For example, let avgmaxLK be the average maximum late data per fragment over a window of multiple consecutive fragments. In operation according to embodiments, RM 121 may be allowed to request additional data for the fragment as long as the condition RK+UK<K+XK+$\alpha$·avgmaxLK is satisfied, where a is a suitably chosen constant (e.g., $\alpha$=0.5, $\alpha$=1, or $\alpha$=1.5). The value of avgmaxLK may, according to embodiments, be updated using a weighted moving average of maxLK, where maxLK is the value for the current fragment (e.g., avgmaxLK is updated as avgmaxLK=$\beta$~avgmaxLK+(1−$\beta$)·maxLK, where $\beta$ is a suitably chosen constant (e.g., $\beta$<1). Alternatively, updating of the value of avgmaxLK of embodiments may implement logic wherein if maxLK>avgmaxLK then avgmaxLK=$\beta$1·avgmaxLK+(1−$\beta$1)·maxLK, whereas if maxLK<avgmaxLK then avgmaxLK=$\beta$2·avgmaxLK+(1−$\beta$2)·maxLK, where 0<$\beta$2<$\beta$1<1. Other examples of averaging logic which may be implemented according to embodiments herein is to use the 95$^{th}$ percentile (or any other suitable percentile) of the value of maxLK over a moving window of the past consecutive fragments for the current fragment.

As another example of operation of RM 121 to determine when and an amount of data to be requested, for late data the RM may keep track of the lateness of that data, whereby the RM may base the decision on whether or not more data can be requested for a fragment based at least partially on the lateness of data. For example, the lateness of data may be calculated as the number of bytes of data received subsequent to the point in time that the data is classified as being late. As another example, the lateness of data may be calculated as the number of bytes of data that was requested subsequent to that data that has been received. A weighting factor may be calculated for each piece of late data based on its lateness. For example, if the lateness of a piece of late data is LB bytes, then the weight of that late piece of data may be calculated as 1+LB/K. As another example, the weight of that late piece of data may be calculated as $e^{LB/K}$. As yet another example, the weight of that late piece of data may be calculated as $2-e^{-LB/UK}$. Irrespective of the particular technique used for calculating the weight, the total weight, wtL, can be calculated as the sum of the weight of all the late data. In operation according to embodiments, RM 121 may be allowed to request additional data for the fragment as long as the condition RK+UK<K+XK+wtL is satisfied. The maximum of wtL over the fragment so far may be substituted for wtL in the foregoing condition in accordance with an alternative embodiment.

Irrespective of the particular logic employed in determining when and an amount of data to be requested, in operation of a RM-auto-FEC technique in accordance with the embodiment of flow 300 shown in FIG. 3, RM 121 receives content data of the requested fragment as well as FEC data beyond the requested fragment in response to the fragment and extra data request (block 304). As with the RM-fixed-FEC techniques above, embodiments of RM 121 implementing a RM-auto-FEC technique herein may recover the fragment using the earliest received data (whether the fragment data or combination of fragment data and FEC data) sufficient to provide for recovery of the fragment. Moreover, through dynamically adjusting whether and how much FEC data is requested with respect to any particular fragment based upon network conditions (e.g., the amount of late data and lateness of requested data), increases to the amount of data transferred over the network may be minimized or optimized. The fragment may thus be recovered by RM 121 expeditiously, with minimal impact to network congestion, and provided to UA 129 for consumption of the content (block 305).

Figure 5:
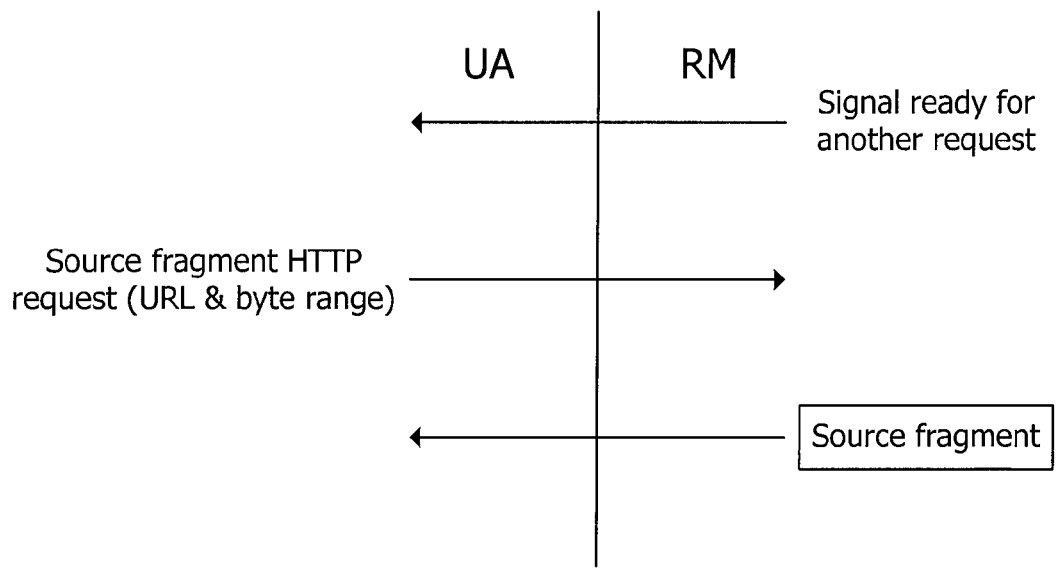
FIG. 5 shows an application programming interface as may be implemented between a Request Manager and a User Agent of embodiments of the present disclosure.

In a variation of a RM-auto-FEC configuration, RM 121 of embodiments may be adapted to not only automatically determine how much FEC to use with respect to the fragments, but also operates to automatically determine the URLs for the FEC fragments thereby providing a configuration of RM 121 implementing a FEC data technique referred to herein as RM-auto-FEC+URL. In operation according to embodiments of a RM-auto-FEC+URL technique, RM 121 automatically determines the URLs for the FEC fragments from the UA provided URLs of source fragments. A RM-auto-FEC+URL technique of embodiments also comprises RM 121 determining the size of symbols to use for FEC encoding and decoding (e.g., the RM automatically determines the symbol size to use based on the size of the fragment, the RM reads the first portion of the FEC fragment wherein the symbol size is available in a preamble of the FEC fragment, etc.). It should be appreciated that RM-auto-FEC+URL techniques may be used by any UA configuration, including UAs without any FEC semantics or logic used by the UA (e.g., as long as FEC fragments are available for the source fragments requested by the UA). A basic API as may be implemented between UA 129 and RM 121 configured for RM-auto-FEC+URL operation is illustrated in FIG. 5.

A variation of a RM-auto-FEC+URL configuration provides a configuration in which RM 121 of embodiments is further adapted to automatically determine whether to use redundant encoded data, thereby providing a configuration of RM 121 implementing a FEC data technique referred to herein as RM-fully-auto. In operation according to embodiments of a RM-fully-auto technique, RM 121 of embodiments herein operates to automatically determine whether or not to use FEC data. In operation, RM 121 and CM 122 may cooperate to automatically determine (e.g., for each fragment or sequence of fragments) whether or not FEC fragments are available. For example, CM 122 may send one or more requests for FEC fragments, whereby RM 121 determining their availability depending on the response (e.g., a response of "404 not found" to an HTTP request for a portion of a FEC fragment may be utilized to indicate that the FEC fragment is not available). If FEC fragments are not available then RM 121 and CM 122 may proceed with operation according to techniques that do not use FEC data. However, if it is determined that FEC fragments are available then RM 121 and CM 122 may utilize FEC data techniques (e.g., implement a RM-auto-FEC+URL technique) in association with the fragment requests in accordance with the concepts herein. Thus, when FEC data is available for the requested fragments, the FEC data may automatically be used by RM 121 and CM 122, and when FEC data is not available RM 121 and CM 122 may nevertheless operate without using FEC data. Thus, any configuration of UA 129 can use the RM-fully-auto method, without any FEC semantics or logic used by the UA, whether or not FEC fragments are available.

One potential use case for implementation of a RM-auto-FEC technique as described herein is for RM 121 configured for RM-auto-FEC operation to be implemented in conjunction with CM 122 configured for multiple connection operation (e.g., CM-mHTTP configuration) for low latency live streaming using DASH or HLS.

In such live streaming situations, the end-to-end latency between when an event is captured by video camera and when the corresponding event is displayed on an end user device should be minimized. The live stream is encoded into a sequence of video fragments, where for example each fragment contains one second of the video stream. As each video fragment is being produced, it is being made available to HTTP web servers from which DASH clients or HLS clients can access the fragments using standard HTTP/TCP. In more challenging network conditions it is beneficial for the DASH or HLS client to use multiple HTTP/TCP connections to be able to provide a better quality video stream than might be possible using a single HTTP/TCP connection to download the video fragments.

One metric of importance is the receiver side latency, which is defined as the time between when a fragment of the video is available on the HTTP web servers till the time the fragment of video is ready for playback on the end device. Typically, the receiver side latency is a major contributor to the end-to-end latency. Thus, minimizing the receiver side latency can be crucial to minimizing the end-to-end latency. In implementation of embodiments herein, the DASH client or the HLS client is UA 129, and the UA is using TA 120 (comprising RM 121 and CM 122) to provide the fragments for playback, whereby FEC data may be dynamically requested using the multiple connections to facilitate recovery of the fragments as soon as sufficient data (whether the fragment data alone or a combination of fragment data and the additional data) is received to recover the fragment.

From the foregoing it can be appreciated that embodiments of a transport accelerator utilize redundant encoded data, such as FEC data, in addition to source content data (i.e., non-redundant encoded data) to help accelerate the delivery of the source fragment requests. Such redundant encoded data may be generated using any of a number of known techniques for generating redundant encoded data files. For example, well known FEC data file generation techniques may be utilized according to embodiments herein. In the case where the UA comprises a DASH client, for example, a suitable FEC data file may be generated using techniques as shown and described in U.S. patent application Ser. No. 12/887,495 entitled "ENHANCED BLOCK-REQUEST STREAMING USING COOPERATIVE PARALLEL HTTP," the disclosure of which is hereby incorporated herein by reference.

Figure 6:
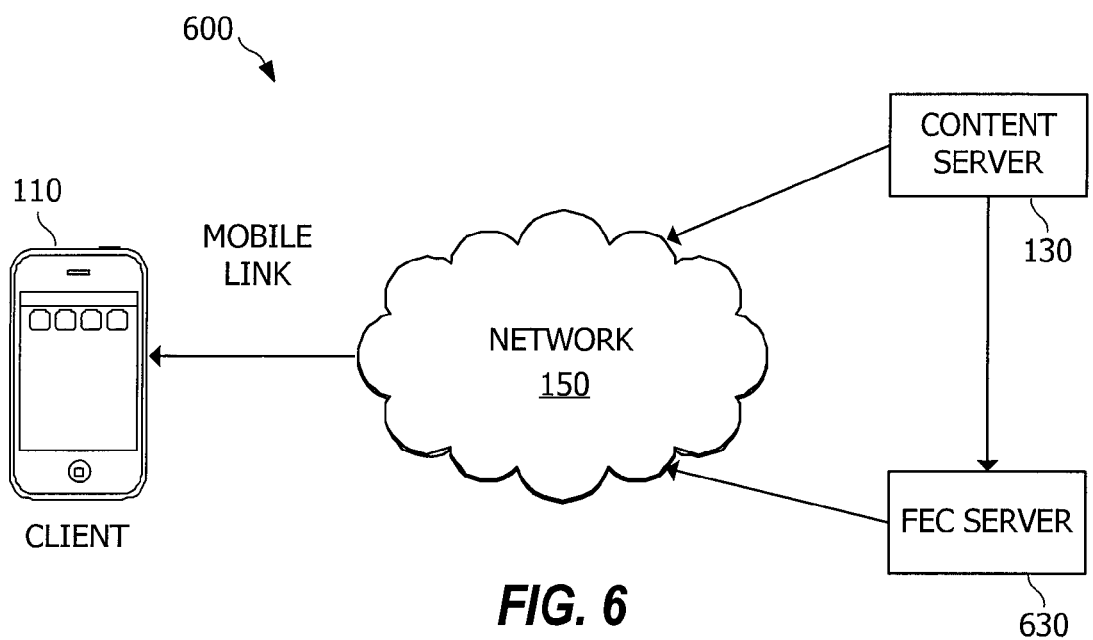
FIG. 6 shows a system adapted to provide transfer of content by a Transport Accelerator implementing selective utilization of redundant encoded content data, wherein the redundant encoded content data is provided by a separate source or provider, according to embodiments of the present disclosure.

It should be appreciated that, although embodiments have been described herein wherein the source fragment files and the corresponding redundant encoded data files are sourced by a same server or server farm (e.g., server 130), the concepts herein are not limited to such implementations. For example, TA 120 of embodiments herein may be adapted to operate with respect to an independent source or provider of redundant encoded data to provide accelerated transport of data in accordance with the concepts herein. For example, a content provider may not have the desire or the resources to provide FEC data for its content. In such a situation, an embodiment of RM 121 may be adapted to operate with an independent third-party FEC provider. The configuration of system 600 shown in FIG. 6 illustrated this concept, wherein FEC server 630 provides redundant encoded data corresponding to the content provided by server 130.

Configurations utilizing an independent source or provider of redundant encoded data, such as system 600, may operate in various ways to transfer content herein. For example, RM 121 of embodiments operates to issue the source requests to the content provider (server 130) and FEC requests to the FEC provider (FEC server 630). In such an embodiment, the FEC provider may thus fetch content independently from the content provider, FEC encode it, and send FEC encoded symbols back to RM 121. Accordingly, RM 121 may operate to start fetching FEC data for any resource it requests immediately, rather than fetching all the source data first to thereby avoid latency resulting from the FEC provider first needing to fetch the source segments itself, and then having to encode the data, before sending encoded symbols to the source.

In another example of a configuration utilizing an independent source or provider of redundant encoded data, RM 121 operates to fetch both the source data and additional data via the FEC provider (e.g., FEC server 630). The FEC provider in such an embodiment may thus operate like a proxy, fetching the source data itself from the source provider (e.g., server 130), and computing FEC data on the fly. An advantage of this embodiment is that the content provider does not need to cope with increased traffic due to the use of FEC data (e.g., in the above example, wherein RM 121 is requesting the source data from the content provider and the additional data from the FEC provider, the content provider sends each data segment to both FEC server 630 (for FEC encoding) and to UA 129).

In operation according to embodiments, the FEC provider (e.g., FEC server 630) may provide a simple generic redundant encoding. For example, the data units (e.g., fragments) being encoded may be fixed and determined by the content alone. The FEC symbol size may likewise be fixed and determined by the content. Such an embodiment may be utilized to reduce the need of the FEC provider to repeatedly FEC encode the same data for different clients (e.g., the FEC provider may cache popular content, thus trading network traffic and computation cost for memory storage).

In accordance with embodiments herein, a FEC provider may be generic to the UA, whereby the UA may specify the resource (e.g., using a URI), byte range, symbol size, etc. of the content it requests, and the FEC provider may then produce the requested FEC coding on the fly (e.g., the foregoing information may be passed in a URL query string to the FEC content provider). In operation according to such an embodiment, the FEC provider may provide exactly the requested FEC data (or return an error code where it is impractical to do). An advantage of such an embodiment is that a UA is enabled to pick parameters best suited for its use case (e.g., a UA providing a very short end-to-end latency might pick shorter FEC protection periods as compared to a UA not concerned with short end-to-end latency).

The techniques described herein can be adapted according to embodiments to cases when there is no FEC provider, and FEC data may therefore not be used. For example, a UA may use the same or similar algorithms as described to identify which requests are "late", such as to use this information to reissue duplicate chunk requests for the detected late portions, rather than requesting FEC data. Therefore, in operation according to embodiments if a TCP connection receives data very slowly, or stops receiving new data at all, the duplicate request may help in obtaining the missing pieces.

Such duplicate requests may refer to a segment stored in reverse order from the usual, so that gaps would be filled from two ends by default. Alternatively, the UA may refer to the normal segment, but use multiple byte ranges to achieve an approximate reversal of the order of the response (e.g., if a hole from 6 KB to 10 KB would need to be filled, a client may use a HTTP byte range of 9 KB-10 KB, 8 KB-9 KB, 7 KB-8 KB, 6 KB-7 KB, and it would hence receive the blocks in reverse order). A good block size for such an approach would be approximately a TCP MSS.

An additional technique in similar spirit that a client may apply according to embodiments is to not request completely disjoint chunks, but request chunks with an overlapping piece of data, in a proactive manner. For example, if a piece of 200 KB in a stream is to be requested in 2 chunks, instead of requesting from 0-100 KB in the first chunk, and from 100 KB-200 KB in the second chunk, the UA may request 0-100 KB in the first chunk, and, e.g., 94 KB-200 KB in the second chunk, resulting in a 6 KB overlap. This strategy takes into account the fact that the last pieces of a chunk are much more liable to encounter substantial delay than the ones earlier in the response. If any early TCP segment is lost, duplicate acknowledgments received by the sender will usually trigger a retransmission fairly quickly. The same is not true for TCP segments towards the end of a transmission (e.g., in those cases, the sender might not receive enough duplicate ACKs to trigger a retransmission, and it would therefore only retransmit the data once a timeout occurs, which is usually a much longer time). In addition to that, any delay in the middle of a chunk is liable to also cause a delay to the reception of the end of a chunk.

Logic of the UA may implement a strategy to reduce the amount of overlap needed. For example, the UA may disable "delayed ACKs" towards the end of chunk responses, thereby increasing the likelihood of duplicate ACKs being seen by the server for the last few TCP segments.

A smart server could be used to further reduce the needed amount of overlap. For example, a server of embodiments may send much smaller TCP segments for the last pieces of transmission than the ones it uses in general.

Although selected aspects have been illustrated and described in detail, it will be understood that various substitutions and alterations may be made therein without departing from the spirit and scope of the present invention, as defined by the following claims.

What is claimed is:

1. A method for accelerating, by a transport accelerator (TA) of a client device, delivery of content to a user agent (UA) of the client device, the method comprising:
   receiving, by a request manager (RM) of the TA, fragment requests provided by the UA for requesting content from a content server;
   determining an amount of redundant encoded content data to request for a fragment request of the fragment requests for use by the RM in recovering the content of a fragment corresponding to the fragment request; and
   determining, by the RM, when the amount of redundant encoded content data is to be requested for the fragment request, wherein the determining when the amount of redundant encoded content data is to be requested comprises deeming, by the RM, previously requested data to be late.

2. The method of claim 1, wherein the redundant encoded content data comprises forward error correction (FEC) encoded data.

3. The method of claim 2, wherein the RM employs FEC decoding to data received by the RM in order to recover the content of the fragment request made by the UA and to provide the UA with a corresponding recovered fragment.

4. The method of claim 1, wherein Hypertext Transfer Protocol/Transmission Control Protocol (HTTP/TCP) is utilized in requesting the content and the redundant encoded content data and in transmission of content from the content server in response to the requesting.

5. The method of claim 4, wherein resource identification information associated with the fragment request is used to determine a HTTP request for a portion of a redundant encoded content fragment used to provide at least a portion of the redundant encoded content data.

6. The method of claim 1, further comprising:
determining, by the RM, a plurality of chunk requests based on the fragment request of the fragment requests, wherein at least one chunk request of the plurality of chunk requests comprises a request for a portion of the fragment corresponding to the fragment request, and wherein at least another one chunk request of the plurality of chunk requests comprises a request for a portion of a redundant encoded content fragment associated with the fragment corresponding to the fragment request.

7. The method of claim 6, further comprising:
requesting, by the RM, two or more of the plurality of chunk requests from the content server in parallel via a plurality of connections managed by a connection manager (CM) of the TA.

8. The method of claim 7, wherein the request for a portion of the fragment requested by the UA is made to a content server via a first connection of the plurality of connections and the request for a portion of the redundant encoded content fragment is made to a redundant encoded content data server via a second connection of the plurality of connections, wherein the content server and the redundant encoded content data server are separate and independent servers.

9. The method of claim 6, wherein the amount of redundant encoded content data to request for a fragment is based on a maximum amount of concurrently late data for the fragment during reception of chunks for the fragment, wherein a first data within a chunk is classified as late at a particular point in time if the first data has been requested by the RM but not yet received and at least some second data was requested after the first data and has been received.

10. The method of claim 9, wherein the RM is adapted to make additional chunk requests for the fragment as long as a total amount of received data for the fragment plus an amount of requested but not yet received data for the fragment is within an additive constant number of bytes of a size of the fragment plus the maximum amount of concurrently late data for the fragment up to a point in time.

11. The method of claim 1, wherein the determining an amount of redundant encoded content data to request for a fragment comprises:
determining additional redundant encoded content data to be requested for the fragment based on not receiving previously requested data for the fragment fast enough, wherein the additional redundant encoded content data is determined to be requested although an amount of previously requested data is sufficient for the RM to fully recover the fragment when the previously requested data arrives, and although all of the previously requested data will be received by the RM.

12. The method of claim 1, wherein the determining an amount of redundant encoded content data to request for a fragment request is based at least in part on current network conditions.

13. The method of claim 12, wherein the current network conditions comprise a bandwidth-delay product determined as a function of a current download rate (R) and a current round-trip time (RTT).

14. The method of claim 1, wherein the determining an amount of redundant encoded content data to request for a fragment request comprises:
determining a total amount of data to request for the fragment request, the total amount of data including the amount of redundant encoded content data and an amount of content data which is not error correction encoded.

15. The method of claim 1, further comprising:
dynamically adjusting, by the RM, an amount of redundant encoded content data to request in association with each of a plurality of fragment requests.

16. The method of claim 1, further comprising:
determining, by the RM, whether redundant encoded content data is to be requested in association with any particular fragment request of the fragment requests provided by the UA.

17. The method of claim 16, wherein the determining whether redundant encoded content data is to be requested comprises:
determining, by the TA, that redundant encoded content data is available for one or more fragments of the fragment requests provided by the UA.

18. The method of claim 1, wherein the UA does not include logic for utilizing redundant encoded content data.

19. The method of claim 18, wherein the redundant encoded content data comprises forward error correction (FEC) encoded data.

20. An apparatus configured for accelerating, by a transport accelerator (TA) of a client device, delivery of content to a user agent (UA) of the client device, the apparatus comprising:
means for receiving, by a request manager (RM) of the TA, fragment requests provided by the UA for requesting content from a content server;
means for determining an amount of redundant encoded content data to request for a fragment request of the fragment requests for use by the RM in recovering the content of a fragment corresponding to the fragment request; and
means for determining, by the RM, when the amount of redundant encoded content data is to be requested for the fragment request, wherein the means for determining when the amount of redundant encoded content data is to be requested comprises means for deeming, by the RM, previously requested data to be late.

21. The apparatus of claim 20, wherein the redundant encoded content data comprises forward error correction (FEC) encoded data.

22. The apparatus of claim 21, wherein the RM employs FEC decoding to data received by the RM in order to recover the content of the fragment request made by the UA and to provide the UA with the recovered fragment.

23. The apparatus of claim 20, wherein Hypertext Transfer Protocol/Transmission Control Protocol (HTTP/TCP) is utilized in requesting the content and the redundant encoded content data and in transmission of content from the content server in response to the requesting.

24. The apparatus of claim 23, wherein resource identification information associated with the fragment request is used to determine a HTTP request for a portion of a redundant encoded content fragment used to provide at least a portion of the redundant encoded content data.

25. The apparatus of claim 20, further comprising:
means for determining, by the RM, a plurality of chunk requests based on the fragment request of the fragment requests, wherein at least one chunk request of the plurality of chunk requests comprises a request for a portion of the fragment corresponding to the fragment request, and wherein at least another one chunk request of the plurality of chunk requests comprises a request for a portion of a redundant encoded content fragment associated with the fragment corresponding to the fragment request.

26. The apparatus of claim 25, further comprising:
means for requesting, by the RM, two or more of the plurality of chunk requests from the content server in parallel via a plurality of connections managed by a connection manager (CM) of the TA.

27. The apparatus of claim 26, wherein the request for a portion of the fragment requested by the UA is made to a content server via a first connection of the plurality of connections and the request for a portion of the redundant encoded content fragment is made to a redundant encoded content data server via a second connection of the plurality of connections, wherein the content server and the redundant encoded content data server are separate and independent servers.

28. The apparatus of claim 25, wherein the amount of redundant encoded content data to request for a fragment is based on a maximum amount of concurrently late data for the fragment during the reception of chunks for the fragment, wherein a first data within a chunk is classified as late at a particular point in time if the first data has been requested by the RM but not yet received and at least some second data was requested after the first data and has been received.

29. The apparatus of claim 28, wherein the RM is adapted to make additional chunk requests for the fragment as long as a total amount of received data for the fragment plus an amount of requested but not yet received data for the fragment is within an additive constant number of bytes of a size of the fragment plus the maximum amount of concurrently late data for the fragment up to a point in time.

30. The apparatus of claim 20, wherein the means for determining an amount of redundant encoded content data to request for a fragment comprises:
means for determining additional redundant encoded content data to be requested for the fragment based on not receiving previously requested data for the fragment fast enough, wherein the additional redundant encoded content data is determined to be requested although an amount of previously requested data is sufficient for the RM to fully recover the fragment when the previously requested data arrives, and although all of the previously requested data will be received by the RM.

31. The apparatus of claim 20, wherein the means for determining an amount of redundant encoded content data to request for a fragment request comprises:
means for determining an amount of redundant encoded content data based at least in part on current network conditions.

32. The apparatus of claim 31, wherein the current network conditions comprise a bandwidth-delay product determined as a function of a current download rate (R) and a current round-trip time (RTT).

33. The apparatus of claim 20, wherein the means for determining an amount of redundant encoded content data to request for a fragment request comprises:
means for determining a total amount of data to request for the fragment request, the total amount of data including the amount of redundant encoded content data and an amount of content data which is not error correction encoded.

34. The apparatus of claim 20, further comprising:
means for dynamically adjusting, by the RM, an amount of redundant encoded content data to request in association with each of a plurality of fragment requests.

35. The apparatus of claim 20, further comprising:
means for determining, by the RM, whether redundant encoded content data is to be requested in association with any particular fragment request of the fragment requests provided by the UA.

36. The apparatus of claim 35, wherein the means for determining whether redundant encoded content data is to be requested comprises:
means for determining, by the TA, that redundant encoded content data is available for one or more fragments of the fragment requests provided by the UA.

37. The apparatus of claim 20, wherein the UA does not include logic for utilizing redundant encoded content data.

38. The apparatus of claim 37, wherein the redundant encoded content data comprises forward error correction (FEC) encoded data.

39. A computer program product for accelerating, by a transport accelerator (TA) of a client device, delivery of content to a user agent (UA) of the client device, the computer program product comprising:
a non-transitory computer-readable medium having program code recorded thereon, the program code including:
program code to receive, by a request manager (RM) of the TA, fragment requests provided by the UA for requesting content from a content server;
program code to determine an amount of redundant encoded content data to request for a fragment request of the fragment requests for use by the RM in recovering the content of a fragment corresponding to the fragment request; and
program code to determine, by the RM, when the amount of redundant encoded content data is to be requested for the fragment request, wherein the program code to determine when the amount of redundant encoded content data is to be requested comprises program code to deem, by the RM, previously requested data to be late.

40. The computer program product of claim 39, further comprising:
program code to determine, by the RM, a plurality of chunk requests based on the fragment request of the fragment requests, wherein at least one chunk request of the plurality of chunk requests comprises a request for a portion of the fragment corresponding to the fragment request, and wherein at least another one chunk request of the plurality of chunk requests comprises a request for a portion of a redundant encoded content fragment associated with the fragment corresponding to the fragment request.

41. The computer program product of claim 40, wherein the amount of redundant encoded content data to request for a fragment is based on a maximum amount of concurrently late data for the fragment during reception of chunks for the fragment, wherein a first data within a chunk is classified as late at a particular point in time if the first data has been requested by the RM but not yet received and at least some second data was requested after the first data and has been received.

42. The computer program product of claim 39, wherein the program code to determine an amount of redundant encoded content data to request for a fragment comprises:

program code to determine additional redundant encoded content data to be requested for the fragment based on not receiving previously requested data for the fragment fast enough, wherein the additional redundant encoded content data is determined to be requested although an amount of previously requested data is sufficient for the RM to fully recover the fragment when the previously requested data arrives, and although all of the previously requested data will be received by the RM.

43. The computer program product of claim 39, wherein determining an amount of redundant encoded content data to request for a fragment request by the program code to determine an amount of redundant encoded content data is based at least in part on current network conditions.

44. The computer program product of claim 39, further comprising:
program code to dynamically adjust, by the RM, an amount of redundant encoded content data to request in association with each of a plurality of fragment requests.

45. The computer program product of claim 39, further comprising:
program code to determine, by the RM, whether redundant encoded content data is to be requested in association with any particular fragment request of the fragment requests provided by the UA.

46. An apparatus configured for accelerating, by a transport accelerator (TA) of a client device, delivery of content to a user agent (UA) of the client device, the apparatus comprising:
at least one processor; and
a memory coupled to the at least one processor, wherein the at least one processor is configured:
to receive, by a request manager (RM) of the TA, fragment requests provided by the UA for requesting content from a content server;
to determine an amount of redundant encoded content data to request for a fragment request of the fragment requests for use by the RM in recovering the content of a fragment corresponding to the fragment request; and
to determine, by the RM, when the amount of redundant encoded content data is to be requested for the fragment request, wherein the at least one processor configured to determine when the amount of redundant encoded content data is to be requested is further configured to deem, by the RM, previously requested data to be late.

47. The apparatus of claim 46, wherein the at least one processor is further configured:
to determine a plurality of chunk requests based on the fragment request of the fragment requests, wherein at least one chunk request of the plurality of chunk requests comprises a request for a portion of the fragment corresponding to the fragment request, and wherein at least another one chunk request of the plurality of chunk requests comprises a request for a portion of a redundant encoded content fragment associated with the fragment corresponding to the fragment request.

48. The apparatus of claim 47, wherein the amount of redundant encoded content data to request for a fragment is based on a maximum amount of concurrently late data for the fragment during reception of chunks for the fragment, wherein a first data within a chunk is classified as late at a particular point in time if the first data has been requested by the RM but not yet received and at least some second data was requested after the first data and has been received.

49. The apparatus of claim 46, wherein the at least one processor configured to program code to determine an amount of redundant encoded content data to request for a fragment is further configured:
to determine additional redundant encoded content data to be requested for the fragment based on not receiving previously requested data for the fragment fast enough, wherein the additional redundant encoded content data is determined to be requested although an amount of previously requested data is sufficient for the RM to fully recover the fragment when the previously requested data arrives, and although all of the previously requested data will be received by the RM.

50. The apparatus of claim 46, wherein determining an amount of redundant encoded content data to request for a fragment request by the at least one processor is based at least in part on current network conditions.

51. The apparatus of claim 46, wherein the at least one processor is further configured:
to dynamically adjust, by the RM, an amount of redundant encoded content data to request in association with each of a plurality of fragment requests.

52. The apparatus of claim 46, wherein the at least one processor is further configured:
to determine, by the RM, whether redundant encoded content data is to be requested in association with any particular fragment request of the fragment requests provided by the UA.

* * * * *